US012348235B2

(12) United States Patent
Hazra et al.

(10) Patent No.: US 12,348,235 B2
(45) Date of Patent: Jul. 1, 2025

(54) SUPPLY VOLTAGE BASED OR TEMPERATURE BASED FINE CONTROL OF A TUNABLE OSCILLATOR OF A PLL

(71) Applicant: Microchip Technology Incorporated, Chandler, AZ (US)

(72) Inventors: Siddhartha Hazra, West Bengal (IN); Hormoz Djahanshahi, Port Moody (CA)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 18/181,477

(22) Filed: Mar. 9, 2023

(65) Prior Publication Data

US 2023/0291408 A1    Sep. 14, 2023

(30) Foreign Application Priority Data

Mar. 9, 2022    (IN) .............................. 202241012666

(51) Int. Cl.
*H03L 7/099* (2006.01)
*H03L 1/00* (2006.01)
*H03L 1/02* (2006.01)

(52) U.S. Cl.
CPC .............. *H03L 7/0991* (2013.01); *H03L 1/00* (2013.01); *H03L 1/026* (2013.01)

(58) Field of Classification Search
CPC . H03L 1/022; H03L 1/026; H03L 1/00; H03L 1/02; H03L 7/099; H03L 2207/06;
(Continued)

(56) References Cited

U.S. PATENT DOCUMENTS 5,204,975 A   4/1993 Shigemori
9,742,354 B2  8/2017 Djahanshahi et al.
(Continued)

FOREIGN PATENT DOCUMENTS

EP        3340467 A1    6/2018
WO    2010/104891 A1    9/2010

OTHER PUBLICATIONS

International Search Report for International Application No. PCT/US2023/064072, mailed Jul. 12, 2023, 6 pages.
(Continued)

*Primary Examiner* — Ryan Johnson
(74) *Attorney, Agent, or Firm* — TraskBritt

(57) ABSTRACT

One or more examples relate, generally to supply voltage based or temperature based fine control of a tunable oscillator of a PLL. An associated method includes: receiving one or more values indicative of temperature or supply voltage of a phase-locked loop (PLL); setting a digital fine-tuning control code to an initialization code, the initialization code at least partially based on the received one or more values indicative of temperature or supply voltage of the PLL, wherein the digital fine-tuning control code for setting a number of tuning-elements within a fine bank of a tunable oscillator; and starting, with the set digital fine-tuning control code, a process to set an initial frequency of the oscillator at or close to a target frequency. The process may be a calibration process performed before initially acquiring lock or re-acquiring lock.

20 Claims, 15 Drawing Sheets

(58) Field of Classification Search
CPC ..... H03L 7/103; H03L 7/104; H03L 2207/50; H03L 7/0991; H03B 5/04
See application file for complete search history.

(56) References Cited

U.S. PATENT DOCUMENTS

| | | |
|---|---|---|
| 9,787,251 B2 | 10/2017 | Djahanshahi et al. |
| 10,187,071 B2 | 1/2019 | Arora et al. |
| 10,389,301 B2 | 8/2019 | Djahanshahi et al. |
| 10,749,470 B2 | 8/2020 | Djahanshahi et al. |
| 2002/0075080 A1 | 6/2002 | Nelson et al. |
| 2008/0002801 A1* | 1/2008 | Droege .................. H03L 7/113 375/375 |
| 2008/0129398 A1* | 6/2008 | Sun ........................ H03L 7/107 331/117 FE |
| 2017/0093409 A1 | 3/2017 | Djahanshahi et al. |
| 2019/0036537 A1* | 1/2019 | Dorner .................. H03L 7/091 |

OTHER PUBLICATIONS

Written Opinion of the International Searching Authority of International Application No. PCT/US2023/064072, mailed Jul. 12, 2023, 8 pages.

Djahanshahi, Hormoz, et al., Method and Apparatus for Reconfigurable Multicore Oscillator, filed Oct. 4, 2016, U.S. Appl. No. 62/403,939, 52 pages.

\* cited by examiner

US 12,348,235 B2

SUPPLY VOLTAGE BASED OR TEMPERATURE BASED FINE CONTROL OF A TUNABLE OSCILLATOR OF A PLL

CROSS-REFERENCE TO RELATED APPLICATION

This application claims the benefit of the priority date of Indian Provisional Patent Application No. 202241012666, filed Mar. 9, 2022 and titled "DEVICES, SYSTEMS, AND METHOD FOR DIGITAL & MIXED-MODE PHASE-LOCKED-LOOP CALIBRATION," the disclosure of which is incorporated herein in its entirety by this reference.

FIELD

One or more examples relate, generally, to phase-locked loops (PLLs) and fine control of tunable oscillators of the same. One or more examples relate, generally, to initializing a fine-tuning control code for setting a number of tuning-elements in a tunable oscillator. One or more examples relate, generally, to calibrating a PLL after initializing the fine-tuning control code. One or more examples relate, generally, to adding or subtracting tuning-elements to a bank for fine control of a tunable oscillator to compensate for post-calibration temperature or supply voltage drift.

BACKGROUND

A PLL may control a tunable oscillator to generate an output signal having a phase or frequency that has a predetermined relationship to the phase or frequency of a reference signal. A tunable oscillator of the PLL may include tuning-elements that control a phase or frequency of the output signal. As a non-limiting example, a PLL may increase or decrease the number of tuning-elements enabled in a tunable oscillator to maintain the predetermined relationship between the phase or frequency of the output signal and the phase or frequency of the reference signal.

BRIEF DESCRIPTION OF THE DRAWINGS

While this disclosure concludes with claims particularly pointing out and distinctly claiming specific examples, various features and advantages of examples may be more readily ascertained from the following description when read in conjunction with the accompanying drawings, in which:

DETAILED DESCRIPTION

Figure 1:
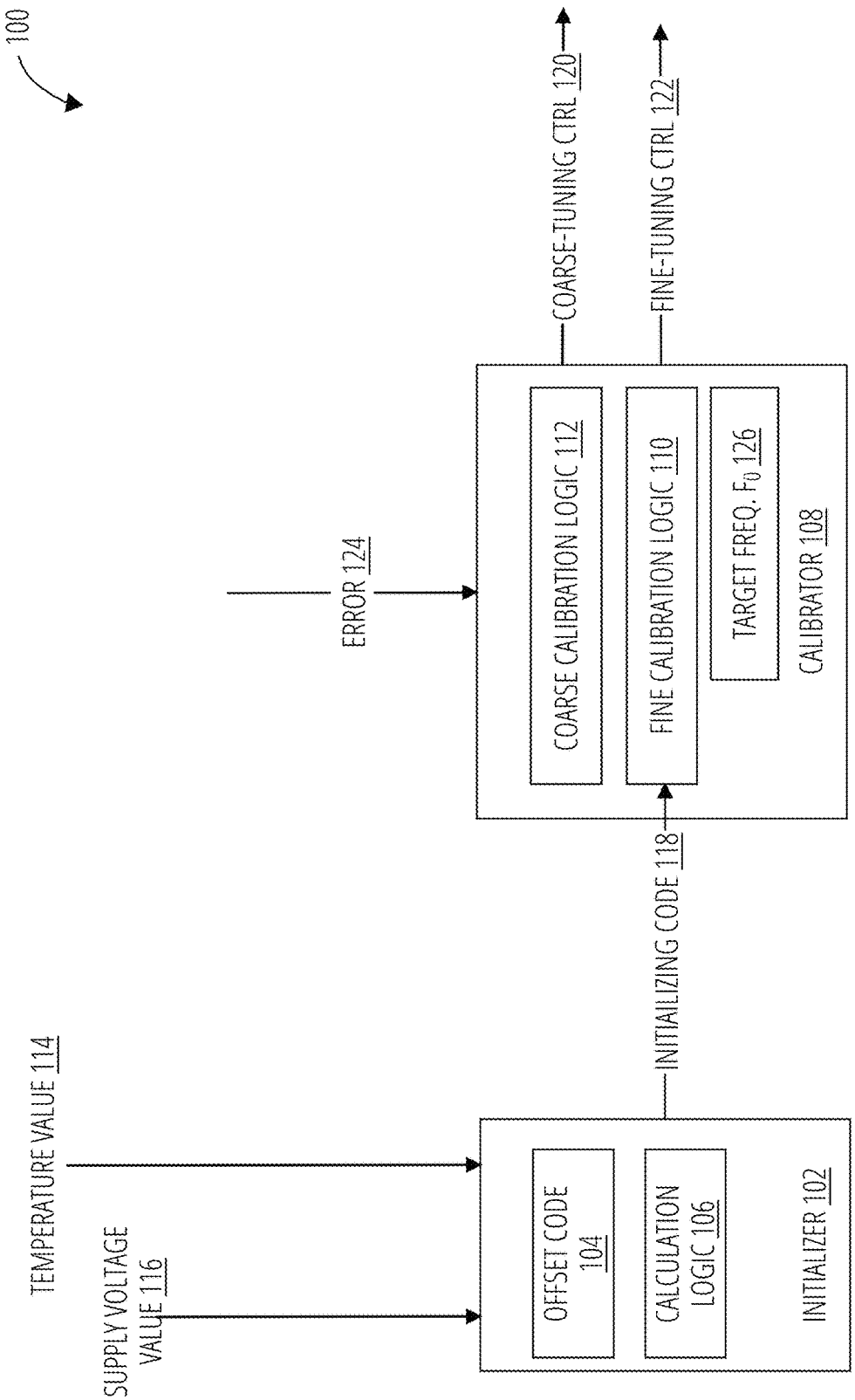
FIG. 1 is a block diagram depicting an apparatus 100 to initialize a fine-tuning control code that may be utilized to control a digitally-controlled fine bank of a tunable oscillator of a PLL, in accordance with one or more examples.

In the following detailed description, reference is made to the accompanying drawings, which form a part hereof, and in which are shown, by way of illustration, specific examples in which the present disclosure may be practiced. These examples are described in sufficient detail to enable a person of ordinary skill in the art to practice the present disclosure. However, other examples may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example of this disclosure to the specified components, steps, features, functions, or the like.

It will be readily understood that the components of the examples as generally described herein and illustrated in the drawing could be arranged and designed in a wide variety of different configurations. Thus, the following description of various examples is not intended to limit the scope of the present disclosure, but is merely representative of various examples. While the various aspects of the examples may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be depicted by block diagram form in order not to obscure the present disclosure in unnecessary detail. Conversely, specific implementations shown and described are only examples and should not be construed as the only way to implement the present disclosure unless specified otherwise herein. Additionally, block definitions and partitioning of logic between various blocks is an example of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. For example, data, instructions, commands, information, signals, bits, and symbols that may be referenced throughout this description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal. A person having ordinary skill in the art would appreciate that this disclosure encompasses communication of quantum information and qubits used to represent quantum information.

The various illustrative logical blocks, modules, and circuits described in connection with the examples disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer executes computing instructions (e.g., software code, without limitation) related to examples of the present disclosure.

The examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, or a subprogram, without limitation. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

In this description the term "coupled" and derivatives thereof may be used to indicate that two elements co-operate or interact with each other. When an element is described as being "coupled" to or with another element, then the elements may be in direct physical or electrical contact or there may be one or more intervening elements or layers present. In contrast, when an element is described as being "directly coupled" to or with another element, then there are no intervening elements or layers present. It will be understood that when an element is referred to as "coupling" a first element and a second element then it is coupled to the first element and it is coupled to the second element.

A PLL generates an output signal exhibiting a phase or frequency having a predetermined relationship to a phase or frequency of a reference signal. Causing and maintaining such a predetermined relationship between phase or frequency of an output signal and a reference signal is referred to herein as "tracking." Such a predetermined relationship may be such that the frequency of the output signal is a multiple of a frequency of the reference signal. As a non-limiting example, the frequency of the output signal may be a fractional multiple of the frequency of the reference signal (e.g., 10.0625, 100.40, 1000+7/11, without limitation). When a PLL reliably tracks an output signal to a reference signal, that is referred to as "locked" or being in "locked state." When locked, if the phase or frequency of a reference signal changes, a PLL correspondingly adjusts the phase or frequency of the output signal to maintain the predetermined relationship.

A typical PLL includes a tunable oscillator that the PLL controls to generate the output signal of the PLL that tracks a reference signal. Non-limiting examples of tunable oscillators include a voltage-controlled oscillator (VCO) that generates an output signal exhibiting a phase or frequency governed by a voltage of a control signal, a current-controlled oscillator (CCO) that generates an output signal exhibiting a phase or frequency governed by a current of a control signal, a digitally-controlled oscillator (DCO) that generates an output signal exhibiting a phase or frequency governed by a value of a control code, and combinations/sub-combinations thereof. The PLL may generate a control code(s) or signal(s) to control a frequency of the output signal. Thus, a PLL may govern the output signal of the PLL by controlling the control code(s) or signal(s) of the tunable oscillator.

A PLL may include one or more control paths to generate the control code(s) or signal(s) that control the output signal generated by a tunable oscillator. Non-limiting examples include a proportional control path and an integral control path. Such control paths may include analog circuits, digital circuits, and combinations thereof (a PLL that includes a combination of analog and digital control paths is sometimes referred to as a "hybrid PLL" or "mixed-mode PLL," and a PLL that includes only digital control paths is referred to as a "digital-PLL").

Generally speaking, a tunable oscillator may include tuning-elements (e.g., controlled (e.g., current-controlled or voltage-controlled, without limitation) active or passive delay elements, without limitation), the number of which controls the frequency of the output signal. A PLL may include a bank of available tuning-elements, and selectively increases or decreases the number of tuning-elements (which may include enabling, disabling, coupling, or de-coupling, such tuning-elements, without limitation) in the tunable oscillator via the control code(s) or signal(s) to increase or decrease the frequency of an output signal and track a reference signal.

A PLL should maintain the predetermined relationship between output signal and reference signal despite environmental changes affecting components of the PLL (e.g., changes resulting from supply voltage drift or temperature drift, without limitation). For example, a PLL should compensate for voltage or temperature drift influencing the PLL's ability to track the reference signal.

Prior to attempting to obtain, or re-obtain, lock, a PLL typically performs calibration operations to set an initial frequency of the output signal at, or close to, a target frequency. A PLL may include a logic circuit (a "calibrator"), among other things, to set the number of tuning-elements (e.g., increase, decrease, or hold the same, the number of tuning-elements, without limitation) in the tunable oscillator and thereby set an initial frequency of the output signal. Such a calibrator may set the number of tuning-elements such that the initial frequency matches, or is close to, a target frequency. Such a target frequency may be at least partially based on the predetermined relationship to the frequency of the reference signal, defined in a setting of the calibrator, without limitation. Upon setting the initial frequency at, or close to, a target frequency, a PLL may obtain locked state faster and reduce jitter while attempting to obtain locked state relative to a PLL that is not calibrated.

A typical calibrator of a PLL may set the number of tuning-elements to one-half (½) the number of available tuning-elements before performing calibration operations. Setting the number of tuning-elements prior to performing calibration operations is referred to herein as "pre-calibration."

Setting the number of tuning-elements to one-half (½) of the available tuning-elements before performing calibration operations allows the PLL an equal amount of flexibility to increase or decrease the frequency of the output signal. A PLL having one-half (½) of its available tuning-elements in its tuning oscillator has the other one-half (½) available to add and thereby decrease a frequency of the output signal. Further, the one-half of its available tuning-elements in its tuning oscillators are available to subtract to thereby increase the frequency of the output signal.

Environmental conditions affecting a PLL, such as temperature and supply voltage, without limitation, may change. Specifically, "temperature" refers to temperature of the tunable oscillator and indications of the same, and "supply voltage" refers to a supply voltage of the PLL and indications of the same. In various examples, temperature values and supply voltage values may represent temperature and supply voltage at discrete time or time periods, for example, a time or time period before a calibration of a tunable oscillator ("pre-calibration.").

Changes in temperature ("temperature drift") and/or changes in voltage levels ("voltage drift") may affect components of a PLL (including without limitation components of a tunable oscillator of a PLL) which, if unaddressed, may cause the frequency of the output signal to be unstable and therefore unreliable. For example, temperature drift and supply voltage drift may change the parameters of the PLL components, such as capacitance of tuning-elements in the oscillator, or a time constant within a feedback oscillator's loop, without limitation, which in turn can cause the output frequency to become unstable.

In some cases, temperature and voltage conditions may be close to extreme ends, and so temperature drift and/or supply voltage drift may affect the output frequency predominantly in one direction. In such cases, if a calibrator sets the number of tuning-elements to one-half (½) the number of available tuning-elements prior to performing calibration operations, only about one-half (½) the number of tuning-elements may be utilized to compensate for post-calibration frequency drift due to temperature or supply voltage drift, which may be insufficient to compensate for full drift range and may cause a failure to maintain LOCKED state.

As used herein, "post-calibration drift" means a tendency to change oscillator frequency after calibration at least partially due to temperature drift, supply voltage drift, or a combination thereof. Such a tendency to change oscillator frequency may be indicated, as non-limiting examples, by an error signal, integral control signal/code, or a combination thereof.

As a non-limiting example, in a first case, the frequency of the output signal may decrease compared to a starting frequency, e.g., as a result of post-calibration temperature drift from an initial extreme cold temperature toward a hotter temperature, or as a result of supply voltage drift from an initial extreme low supply voltage toward a higher supply voltage without limitation. Thus, the frequency of the output signal may seldom, if ever, increase to be higher than the starting frequency. As the frequency of the output signal decreases due to post-calibration drift, the PLL may compensate by subtracting (e.g., de-coupling, without limitation) tuning-elements (e.g., capacitive tuning-elements, without limitation) within its oscillator. The number of tuning-elements that can be subtracted to adjust the output frequency may determine the amount of output-frequency decrease the PLL can compensate. The set number of tuning-elements determines an upper range limit on the amount of tolerable post-calibration drift of the PLL in the direction that would slow down (a free-running/unlocked version of) the oscillator.

In a non-limiting example, in a second case, the frequency of the output signal may increase compared to a starting frequency e.g., as a result of temperature drift from an initial extreme hot temperature toward a colder temperature, or a result of supply voltage drift from an initial extreme high supply voltage toward a lower supply voltage, without limitation. Thus, the frequency of the output signal may seldom, if ever, decrease to be lower than the starting frequency. As the frequency of the output signal increases, the PLL may compensate by adding (e.g., coupling, without limitation) tuning-elements (e.g., capacitive tuning-elements, without limitation). The number of tuning-elements that can be added to adjust the output frequency may determine the amount of output-frequency increase the PLL can compensate. The set number of tuning-elements determines an upper range limit on the amount of tolerable post-calibration drift of the PLL in the direction that would speed up (a free-running/unlocked version of) the oscillator.

One or more examples relate, generally, to initializing the fine control bank of a tunable oscillator of a PLL, and more specifically, initializing the fine-tuning control code that sets the number of tuning-elements at the fine control bank before setting the coarse-tuning control code and fine-tuning control code that set the coarse bank of tuning-elements and fine bank of tuning-elements of a tunable oscillator.

Initialization, by a calibrator, according to one or more examples may include: setting a number of tuning-elements to include in the fine bank of the tunable oscillator (or setting a number of tuning-elements to exclude from the fine bank of the tunable oscillator).

Increasing the range of temperature or voltage drift that can be compensated, increases functional reliability and reduces risk of failure to maintain lock. As a non-limiting example, initialization may increase the range of temperature or voltage drift that can be compensated for by a calibrator or by a supply voltage drift and temperature drift ("VT drift") controller, as discussed below.

This disclosure is not limited to specific tuning-elements or techniques for adjusting the phase or frequency of a tunable oscillator unless expressly stated. A person having ordinary skill in the art would appreciate that initialization of fine-tuning control codes and post-calibration drift compensation discussed herein may be utilized with tunable oscillators that utilize a variety of types of tuning-elements and combinations of types of tuning-elements.

Non-limiting examples of tuning-elements includes capacitors, inductors, or controlled (e.g., current-controlled or voltage-controlled, without limitation) active or passive delay elements (e.g., voltage, current, or digital-code controlled: current sources, or inverters/delay-elements in ring oscillators or delay-locked loop; voltage-controlled varactors; or digital code-controlled capacitors or inductors in LC oscillators, without limitation), without limitation.

As used herein, "set a number of tuning-elements" and derivatives thereof, means setting the number of tuning-elements that are enabled (or disabled) within a bank of a tunable oscillator, banks of a tunable oscillator, or a tunable oscillator more generally.

Enabling a tuning-element may include adding the tuning-element to a circuit of one or more tuning-elements, which changes the capacitance, inductance, or delay, without limitation, of the circuit or tunable oscillator in a predictable manner, and which changes the output frequency of the tunable oscillator in a predictable manner (e.g., proportional, without limitation). Generally speaking, disabled tuning-elements should negligibly, or not at all, affect the capacitance, inductance, or delay of the circuit (though disabling a tuning-element will increase the output frequency of a tunable oscillator). Increasing capacitance, inductance, or delay of such a circuit or the tunable oscillator, decreases output frequency of the tunable oscillator. Decreasing capacitance, inductance, or delay of such a circuit or the tunable oscillator, increases output frequency of the tunable oscillator. As a non-limiting examples, banks may include switchable couplings (e.g., transistors, without limitation) to add (switchably couple) or subtract (switchably decouple) tuning-elements to the circuit responsive to control codes.

A control code sets the number of tuning-elements, so setting the control code will generally cause setting the number of tuning-elements. In specific examples discussed herein, increasing the value of a control code decreases the number of tuning-elements, which increases output frequency of the tunable oscillator, and decreasing the value of a control code increases the number of tuning-elements, which decreases output frequency of the tunable oscillator. A person of ordinary skill in the art would understand that directionality of control codes is a matter of design choice, as a non-limiting example, at least partially based on specific operating conditions.

As used herein, "code" encompass information and signals represented by both discrete voltage/current levels or digitized voltage/current levels, unless explicitly stated otherwise.

As used herein, a "clock signal" is a signal that oscillates between a high state and a low state in a reliably predictable manner, such as sinusoidal signal or square-wave signal, without limitation.

FIG. 1 is a block diagram depicting an apparatus 100 to initialize a fine-tuning control code that may be utilized to control a digitally-controlled fine bank of a tunable oscillator of a PLL, in accordance with one or more examples. Non-limiting examples of a PLL include a clock synthesizer or clock-and-data recovery PLL.

Apparatus 100 includes an initializer 102 and a calibrator 108. Initializer 102 includes calculation logic 106 and offset code 104. Calibrator 108 includes fine calibration logic 110, coarse calibration logic 112 and target frequency 126.

Apparatus 100 receives temperature value 114, supply voltage value 116, and error signal 124, and generates coarse-tuning control code 120 and fine-tuning control code 122 to set a frequency of an output signal generated by a tunable oscillator (tunable oscillator not depicted by FIG. 1).

Apparatus 100 generates coarse-tuning control code 120 or fine-tuning control code 122 during one or more of two phases. During a first phase (e.g., an "initialization phase," without limitation), the fine-tuning control code 122 is set by calibrator 108 based on an initialization code 118 generated by initializer 102. During a second phase (e.g., a "calibration phase," without limitation), which occurs after the first phase, coarse-tuning control code 120 and fine-tuning control code 122 is set by calibrator 108 based on a coarse calibration process and a fine calibration process.

Generally speaking, coarse-tuning control code 120 and fine-tuning control code 122 may be utilized to set a number of tuning-elements within banks of tuning-elements for discrete or digitized coarse-tuning or discrete or digitized fine-tuning of a tunable oscillator, respectively. Notably, coarse-tuning control code 120 and fine-tuning control code 122 are not utilized for analog or continuous coarse-tuning nor analog or continuous fine-tuning of a tunable oscillator. A value of coarse-tuning control code 120 or fine-tuning control code 122 is indicative of the number of tuning-elements to be set within respective banks of tuning-elements for coarse-tuning or fine-tuning of a tunable oscillator.

Fine-tuning control code 122 and coarse-tuning control code 120 may be set to any of a range of values, where a minimum value of the range corresponds to a respective maximum number of tuning-elements and a lower output frequency. A maximum value of the range corresponds to a respective minimum number of tuning-elements and a higher output frequency. A value halfway between the minimum value and maximum value corresponds to a respective mid-range number of tuning-elements. A code that corresponds to a mid-range number of tuning-elements may be referred to herein as "one-half the range" of fine-tuning control code 122 or coarse-tuning control code 120, as the case may be. In one or more examples, the minimum number and maximum number of tuning-elements may be chosen to be any suitable number of tuning-elements based on specific operating conditions.

Calibrator 108 is a logic circuit that sets an initial frequency of an output signal of a PLL at, or close to, a target frequency 126 in response to a coarse calibration process and a fine calibration process controlled by coarse calibration logic 112 and fine calibration logic 110, respectively. In practice, exact matching of initial frequency to target frequency 126 may not be achievable—as a non-limiting example, it is specifically contemplated that initial frequency may differ from target frequency 126 by some amount of quantization error due to discretized/digitized setting or tuning.

Target frequency 126 represents a desired output frequency of a tunable oscillator or PLL. As non-limiting examples, a value of the target frequency 126 may be set equal to the frequency of a reference signal, set to an integer multiple (e.g., 10, 100, or 1000 times, without limitation) of a frequency of a reference signal, or set to a fractional multiple (e.g., 10.0625, 100.40, 1000+7/11, without limitation) of a frequency of a reference signal.

Calibrator 108 sets the initial frequency of the output signal of the PLL via fine-tuning control code 122 and coarse-tuning control code 120. Coarse-tuning control code 120 is determined and set by coarse calibration logic 112 in response to error signal 124. Fine-tuning control code 122 is determined and set by fine calibration logic 110 in response to initialization code 118 during the so-called "first phase," and in response to error signal 124 during the so-called "second phase."

Error signal 124 is proportional to the difference between the phase, frequency, or both, between two clock signals, e.g., between a reference clock signal and an output clock signal (or signal indicative of the output clock signal such as a frequency-divided version of the output clock signal, without limitation) generated by a PLL to track such a reference clock signal, without limitation. In one example, error signal 124 may be linearly proportional to the difference. The magnitude and direction of error signal 124 is directly proportional to a difference in phase and frequency between the two input clock signals. Error signal 124 may be generated, as non-limiting examples, by a phase-frequency detector, a bang-bang phase detector, a time-to-digital converter, a subsampling phase detector, or a combination/subcombination thereof.

Initializer 102 is a logic circuit that determines initialization code 118 and provides initialization code 118 to calibrator 108. Initializer 102 is both "supply voltage aware" and "temperature aware" because it receives supply voltage value 116 and temperature value 114. Supply voltage value 116 and temperature value 114 represent on-chip supply voltage and on-chip temperature, respectively, at a discrete time or over a discrete time duration. In one or more examples, supply voltage value 116 and temperature value 114 may respectively represent on-chip supply voltage and on-chip temperature for the same discrete time or time duration or for different discrete times or time durations.

Initialization code 118 is utilized by calibrator 108, and more specifically by fine calibration logic 110, to set fine-tuning control code 122 during the so-called "first phase" discussed above. A frequency of a tunable oscillator is set in response to initialization code 118 before calibrator 108 sets coarse-tuning control code 120 and fine-tuning control code 122 to set an initial frequency of a tunable oscillator via a coarse and fine calibration processes.

Calculation logic 106 of initializer 102 sets a value of initialization code 118 (e.g., sets the bits of initialization code 118 to represent a value in a predetermined manner, without limitation) at least partially based on offset code 104.

In one or more examples, a value of offset code 104 may represent an amount by which the number of tuning-elements set at a fine-tuning bank of a tunable oscillator should be increased or decreased from one-half (½) the range of fine-tuning control code 122. In one or more examples, offset code 104 may include polarity information such as a negative polarity indication or a positive polarity indication. When offset code 104 including a negative polarity indication is added to a mid-code the offset code 104 is effectively subtracted from the mid-code, where the term mid-code refers to a code representative of one-half (½) the range of fine-tuning control code 122. When offset code 104 including a positive polarity indication is added to a mid-code offset code 104 is effectively adds from the mid-code. In one or more examples, offset code 104 is a function of temperature, supply voltage, or a combination thereof at pre-calibration time. If temperature and supply voltage at their mid-range values, calculation logic 106 would determine offset code 104 to be zero.

At a temperature greater than mid-range (assuming supply voltage is fixed), output frequency may decrease, so calculation logic 106 may determine offset code 104 including a positive indication to increase the output frequency by subtracting tuning-elements. Conversely, at a temperature less than mid-range (assuming supply voltage is fixed), output frequency may increase, so calculation logic 106 may determine offset code 104 including a negative indication to decrease the output frequency by adding tuning-elements.

Additionally or alternatively, a value of offset code 104 may represent a number of tuning-elements set at a fine bank of a tunable oscillator at least partially based on supply voltage value 116, temperature value 114, or combination thereof. In such an example, an offset code 104 may be provided as initialization code 118 to calibrator 108 and fine calibration logic 110, and fine-tuning control code 122 set equal to offset code 104. In such an example, offset code 104 may not include polarity information such as negative polarity information or positive polarity information.

Offset code 104 is chosen or calculated at least partially based on one, or both, of supply voltage value 116 or temperature value 114. Supply voltage value 116 represents a voltage level, measured on-chip, of a supply voltage Vdd. Temperature value 114 represents a temperature, measured on-chip, of a tunable oscillator.

Calculation logic 106 determines and sets a value of initialization code 118 by increasing or decreasing a code that starts at ½ the range of fine-tuning control code 122, i.e., by increasing or decreasing a mid-code, at least partially based on offset code 104. Stated another way, calculation logic 106 sets the value of initialization code 118 by increasing or decreasing a value that represents ½ the number of tuning-elements within a fine-tuning bank of a tunable oscillator at least partially based on a value of offset code 104.

In one or more examples, offset code 104 may be obtained at least partially based on a look-up table (LUT) that associates one or more temperature values, supply voltage values, or a combination thereof with pre-determined offset codes. In one or more examples, offset code 104 may be obtained directly from such a LUT or interpolated from multiple offset codes stored in the LUT. Additionally or alternatively, calculation logic 106 may calculate offset code 104 as discussed, below. Additionally or alternatively, calculation logic 106 may determine the values of offset codes and store the determined value of offset codes in the LUT, e.g., for later use by calculation logic 106, without limitation.

Figure 2:
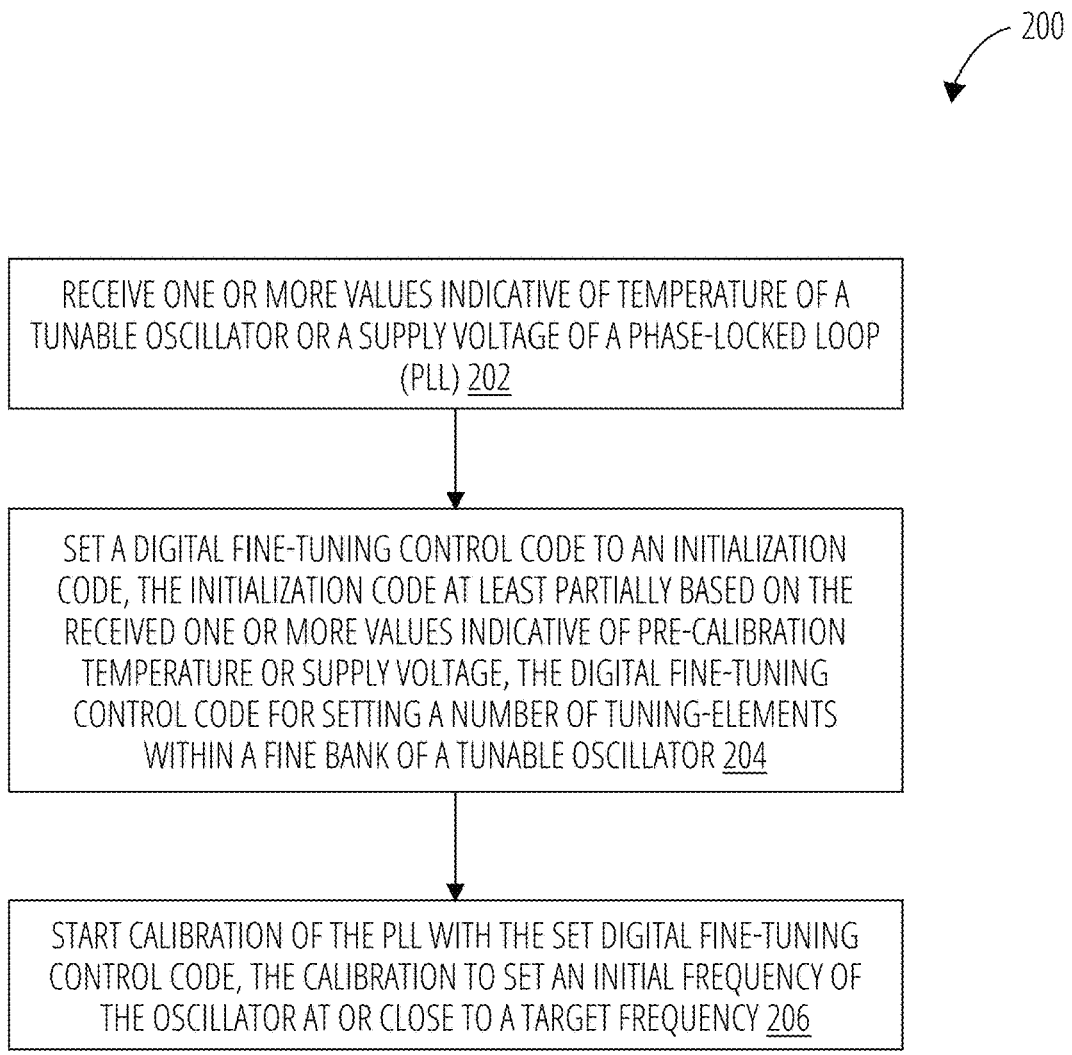
FIG. 2 is a flow diagram depicting a process to initialize the fine bank of tuning-elements of a tunable oscillator, in accordance with one or more examples.

FIG. 2 is a flow diagram depicting a process 200 to initialize the fine bank of tuning-elements of a tunable oscillator, in accordance with one or more examples. As a non-limiting example, some or a totality of operations of process 200 may be performed by apparatus 100.

Although the example process 200 depicts a particular sequence of operations, the sequence may be altered without departing from the scope of the present disclosure. For example, some of the operations depicted may be performed in parallel or in a different sequence that does not materially affect the function of the process 200. In other examples, different components of an example device or system that implements the process 200 may perform functions at substantially the same time or in a specific sequence.

According to one or more examples, process 200 includes receiving one or more values indicative of temperature of a tunable oscillator or supply voltage of a PLL at operation 202. In one or more examples, the one or more values may represent pre-calibration temperature or supply voltage.

According to one or more examples, process 200 includes setting a digital fine-tuning control code to an initialization code at operation 204. The initialization code is at least partially based on the received value indicative of pre-calibration temperature or supply voltage of the PLL. Pre-calibration temperature or supply voltage is temperature or supply voltage observed before performing a given calibration process. The digital fine-tuning control code is for setting a number of tuning-elements within a fine-tuning bank of a tunable oscillator.

According to one or more examples, process 200 includes starting calibration of the PLL with the set digital fine-tuning control code at operation 206. The calibration sets an initial frequency of the oscillator at or close to a target frequency.

Figure 3:
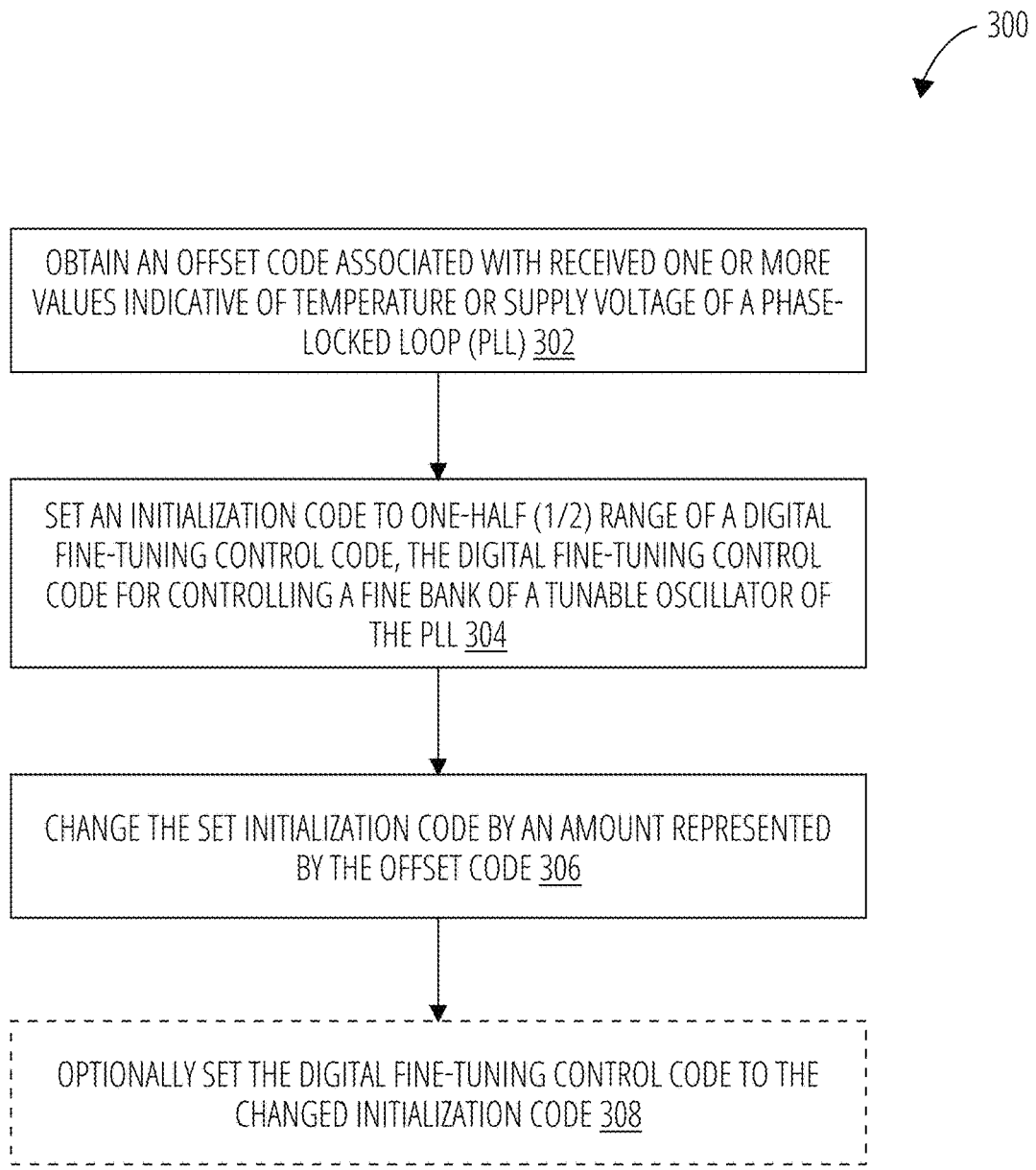
FIG. 3 is a flow diagram depicting a process to set an initialization code that may be utilized to initialize a fine-tuning control code for setting the number of tuning-elements in a fine bank of a tunable oscillator, in accordance with one or more examples.

FIG. 3 is a flow diagram depicting a process 300 to set an initialization code that may be utilized to initialize a fine-tuning control code for setting the number of tuning-elements in a fine bank of a tunable oscillator, in accordance with one or more examples. As a non-limiting example, some or a totality of operations of process 300 may be performed by initializer 102 of FIG. 1. Thus, process 300 is a non-limiting example of operation 204 of FIG. 2.

Although the example process 300 depicts a particular sequence of operations, the sequence may be altered without departing from the scope of the present disclosure. For example, some of the operations depicted may be performed in parallel or in a different sequence that does not materially affect the function of the process 300. In other examples, different components of an example device or system that implements the process 300 may perform functions at substantially the same time or in a specific sequence.

In one or more examples, process 300 includes obtaining an offset code associated with a received value indicative of temperature or supply voltage of a phase-locked loop (PLL) at operation 302. In one or more examples, an offset code may be obtained from a LUT utilizing a supply voltage value, a temperature value, or a combination thereof to search the LUT, or an offset code may be interpolated at least partially based on multiple offset codes retrieved from the LUT. Additionally or alternatively to a LUT, an offset code may be obtained by direct calculation at least partially based on temperature and supply voltage values, as discussed below.

In one or more examples, process 300 includes setting an initialization code to one-half (½) range of a digital fine-tuning control code at operation 304. The digital fine-tuning control code is for controlling a digital fine-tuning bank of a tunable oscillator of a PLL.

In one or more examples, process 300 includes changing the set initialization code by an amount represented by the offset code at operation 306. This may include increasing, decreasing, or holding the same the initialization code.

In one or more examples, process 300 optionally includes setting the digital fine-tuning control code to the changed initialization code at operation 308.

As noted above, additionally or alternatively to representing a delta from the one-half (½) range of the digital fine-tuning control code, in one or more examples the offset code may be calculated such that it represents a final value of the initialization code, in which case the digital fine-tuning control code is set equal to the offset code (or the initialization code is the offset code).

Figure 4:
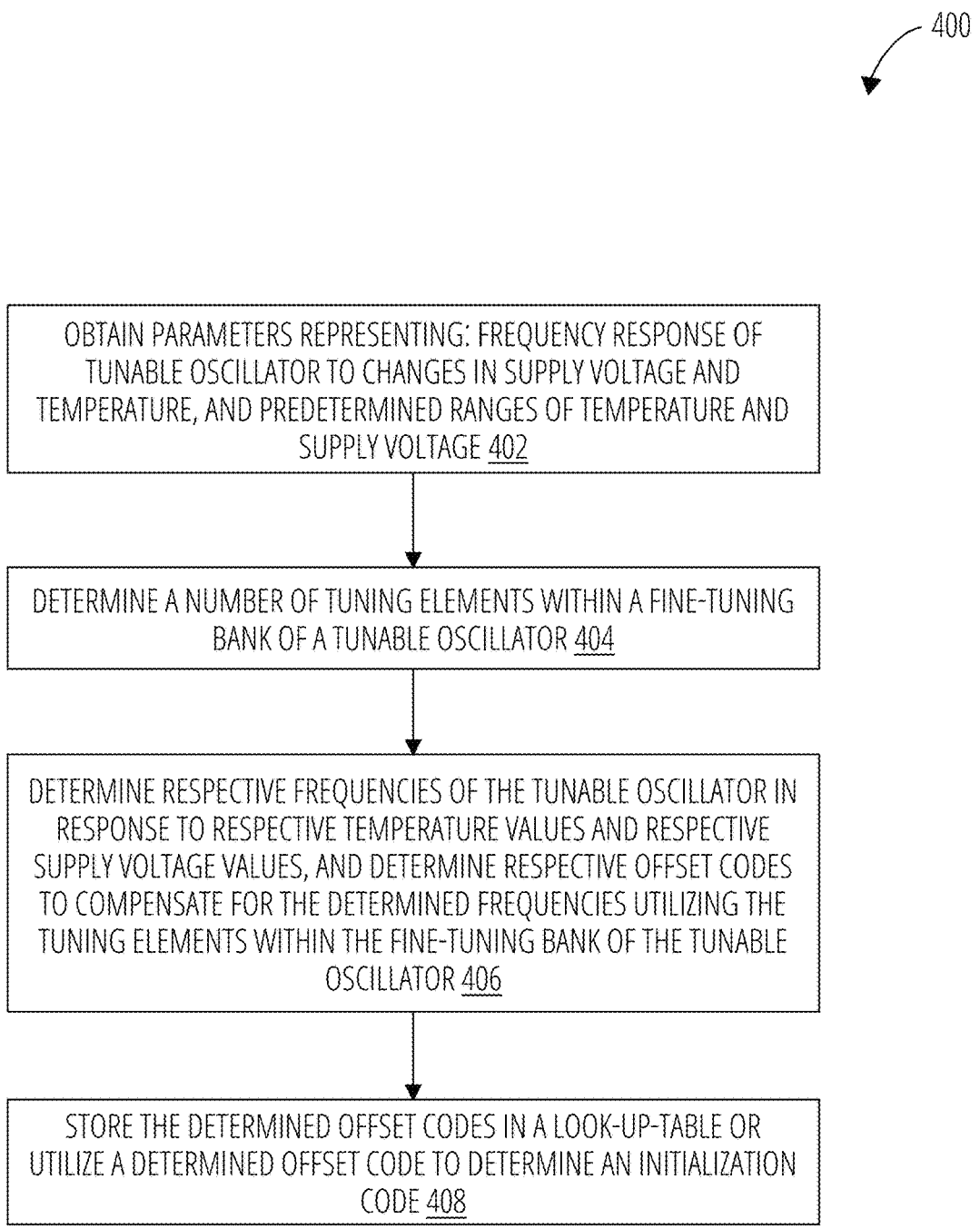
FIG. 4 is a flow diagram depicting a process to obtain offset codes that may be utilized to set an initialization code, in accordance with one or more examples.

FIG. 4 is a flow diagram depicting a process 400 to obtain offset codes that may be utilized to set an initialization code, in accordance with one or more examples. As non-limiting examples, some or a totality of operations of process 400 may be performed by calculation logic 106 of initializer 102 of FIG. 1. Additionally or alternatively, some or a totality of operations of process 400 may be performed by a calculation engine (e.g., calculation logic 106, without limitation) to determine offset codes, and the determined offset codes may be stored at a look-up table (LUT) of initializer 102.

Although the example process 400 depicts a particular sequence of operations, the sequence may be altered without departing from the scope of the present disclosure. For example, some of the operations depicted may be performed in parallel or in a different sequence that does not materially affect the function of the process 400. In other examples, different components of an example device or system that implements the process 400 may perform functions at substantially the same time or in a specific sequence.

According to one or more examples, process 400 includes obtaining parameters representing: frequency response of tunable oscillator to changes in supply voltage and temperature, and predetermined ranges of temperature and supply voltage at operation 402. In one or more examples, the obtained parameters may be values or functions that may be utilized to calculate values.

According to one or more examples, process 400 includes determining a total number of tuning-elements within a fine-tuning bank of a tunable oscillator at operation 404.

According to one or more examples, process 400 includes determining respective frequencies of the tunable oscillator in response to respective temperature values and respective supply voltage values, and determining respective offset codes to compensate for the determined frequencies at operation 406 utilizing the tuning-elements within the fine bank of the tunable oscillator.

Some or a totality of determinations of operation 404 or operation 406 may be performed via design analysis or simulation, or hardware measurement after fabrication, e.g., fabrication of an IC or other logic circuit.

According to one or more examples, process 400 includes storing the determined offset codes in a look-up table or provide the determined offset codes to a calibrator at operation 408.

Figure 5:
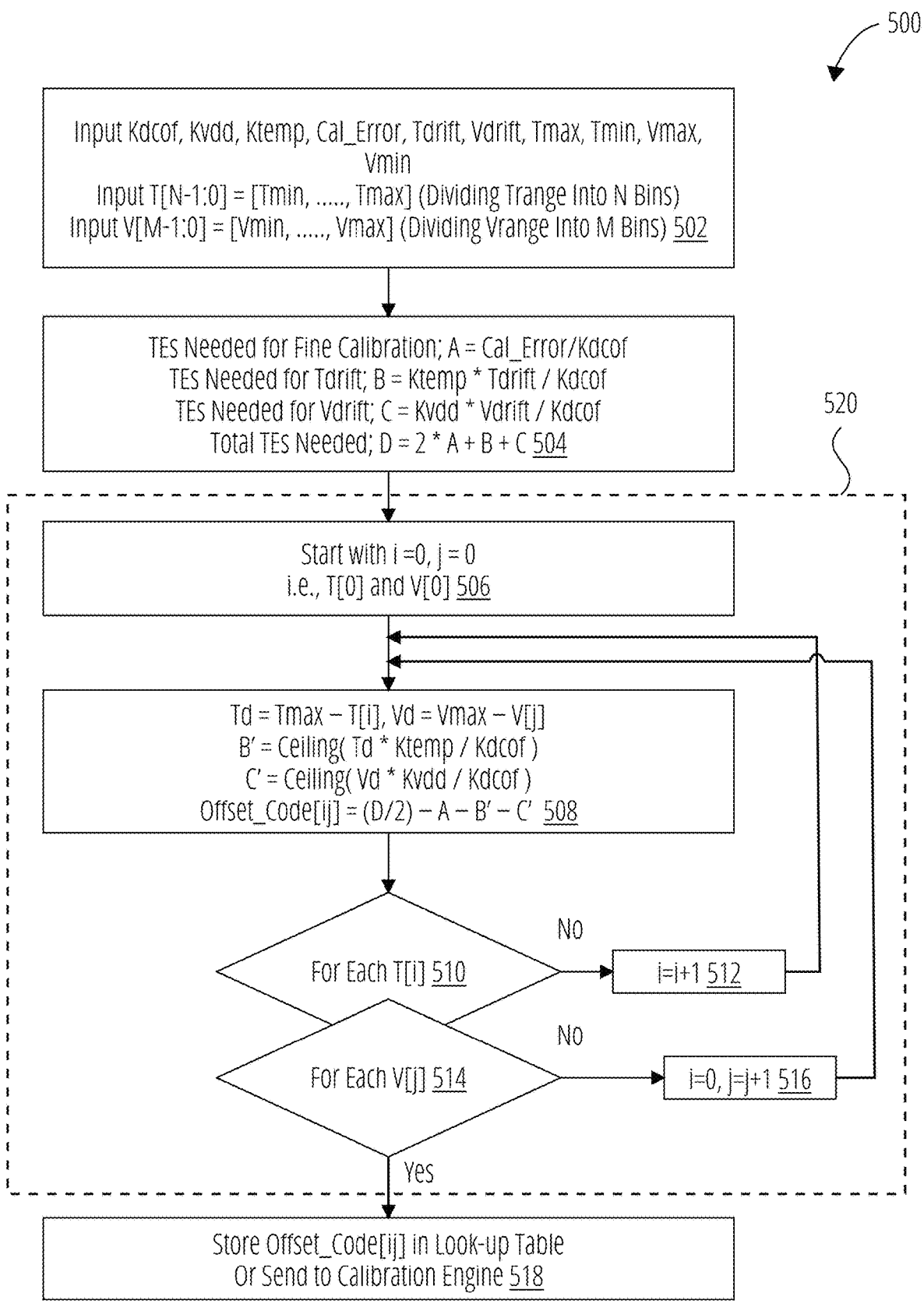
FIG. 5 is a flow diagram depicting a process to obtain offset codes that may be utilized to set an initialization code, in accordance with one or more examples. The process depicted by FIG. 5 may be a specific, non-limiting example of the process depicted by FIG. 4.

FIG. 5 is a flow diagram depicting a process 500 to obtain offset codes that may be utilized to set an initialization code, in accordance with one or more examples. Process 500 is a specific, non-limiting example of process 400.

Although the example process 500 depicts a particular sequence of operations, the sequence may be altered without departing from the scope of the present disclosure. For example, some of the operations depicted may be performed in parallel or in a different sequence that does not materially affect the function of the process 500. In other examples, different components of an example device or system that implements the process 500 may perform functions at substantially the same time or in a specific sequence.

In FIG. 5, "TE" is an abbreviation of "tuning-element."

According to one or more examples, process 500 includes input of various parameters that will be utilized to determine Offset Codes at operation 502. Input includes input of: Kdcof, Kvdd, Ktemp, Cal_Error, Tdrift, Vdrift, Tmax, Tmin, Vmax, Vmin, and setup of Tdrift and Vdrift arrays. operation 502 and is a non-limiting example of operation 402 of FIG. 4.

Kdcof is a value or function that represents the gain of a digital control path of a tunable oscillator.

Kvdd is a value or function that represents the frequency sensitivity (e.g., magnitude of frequency response or linear relationship 'K' between output frequency and supply voltage Vdd, without limitation) of a tunable oscillator to changes in supply voltage.

Ktemp is a value or function that represents the frequency sensitivity (e.g., magnitude of frequency response or linear relationship 'K' between output frequency and temperature temp, without limitation) of a tunable oscillator to changes in temperature.

Additionally or alternatively, in one or more examples, process 500 may assume a non-linear relationship between output frequency and temperature, supply voltage, or combinations thereof. Such a non-linear relationship may be expressed with a general polynomial as: $f(T,V)=a22*(T)^2+b22*(V)^2+a11*T+b11*V+c11*T*V+d$. Where f is the frequency of the oscillator as a function of T and V, and a22, a11, b22, b11, c11, and d are predetermined coefficients of the polynomial.

Cal_Error is a value or function that represents the coarse calibration residual error, which is typically decreased via fine calibration.

Tdrift is a value or function that represents a temperature drift range. In one or more examples, the temperature drift range may be a range defined by Tmin and Tmax, or a percentage thereof.

Vdrift is a value or function that represents a supply voltage drift range. In one or more examples, the supply voltage drift range may be a range defined by Vmin and Vmax, or a percentage thereof.

Input T[N−1:0]=[Tmin, . . . , Tmax], represents division of the temperature drift range between Tmin and Tmax, inclusive, into N bins of codes, where N is an integer. The number of bins, M, sets the temperature resolution of the calculation.

Input V[M−1:0]=[Vmin, Vmax], represents division of the supply voltage range Vrange between Vmin and Vmax, inclusive, into M bins of codes, where M is an integer. The number of bins, M, sets the supply voltages resolution of the calculation. Use of "min" and "max" in "Tmin," "Tmax," "Vmin," "Vmax," is solely to differentiate the least and greatest values utilized in this specific calculation of T[N−1:0] and V[M−1:0], which may, or may not, correspond to minimum and maximum values specified for specific operating conditions or design requirements.

According to one or more examples, process 500 includes determining numbers A, B, C and D of tuning-elements in a bank for fine control of a tunable oscillator at operation 504. Operation 504 may correspond to operation 404 of FIG. 4.

A is a value or function that represents the tuning-elements for fine calibration; where A=Cal_Error/Kdcof.

B is a value or function that represents a number of tuning-elements to address temperature drift; where B=Ktemp*Tdrift/Kdcof.

C is a value or function that represents a number of tuning-elements to address supply voltage drift; where C=Kvdd*Vdrift/Kdcof.

Here, the symbol "*" is used to denote a multiplication operator.

D is a value or function that represents a total number of fine tuning-elements; where D=2A+B+C.

According to one or more examples, process 500 includes performing a For Loop 520 to determine offset codes at least partially based on the assigned temperature values, assigned supply voltage values, and the total number of tuning-elements, at operation 506, operation 508, decision block 510, operation 512, decision block 514 and operation 516. This For Loop 520 corresponds to operation 406 of FIG. 4.

For a given entry of the temperature array and supply voltage arrays T[i] and V[j] (operation 506), process 500 sets a temperature difference Td, a supply voltage difference Vd a ceiling B' for a number of tuning-elements to address Td, a ceiling C' for a number of tuning-elements to address Vd; and determines an offset code=(D/2)−A−B'−C' (operation 508).

Temperature difference Td is a value or function that represents the difference between the given value of temperature array T[i] and Tmax or Tmin. Td represents how far a respective temperature value T[i] is from Tmax (or Tmin) and hence gives the idea how much respective values of T[i] can drift in one direction or other (toward Tmax or toward Tmin).

Voltage difference Vd is a value or function that represents a difference between the given value of supply voltage array V[j] and Vmax or Vmin. Voltage difference Vd represents how far a respective supply voltage value V[i] is from Vmax (or Vmin) and hence, represents how much respective supply voltage values V[i] can drift in one direction or the other (toward Vmax or toward Vmin).

Ceiling B' is a value or function that represents the highest number of tuning-elements that would be needed to address Td; where B'=ceiling(Td*Ktemp/Kdcof).

Celling C' is a value or function that represents a highest number of tuning-elements that would be needed to address Vd; where C'=ceiling(Vd*Kvdd/Kdcof).

In this specific example, "ceiling" is an operator that indicates rounding up to a nearest integer. This disclosure is not limited to utilizing integer values, as a non-limiting example, utilization of fractional values and floating point number representations are specifically contemplated and do not exceed the scope of this disclosure.

Upon calculating the Offset Code, For Loop 520 increments to the next entries in T[i] and V[j] (operation 512 and operation 516) until all entries have been evaluated (decision block 510 and decision block 514).

According to one or more examples, process 500 includes, storing offset_Code[ij] in look-up table (LUT) or sending to a Calibration Engine at operation 518.

Notably, respective iterations of For Loop 520 generate respective offset codes. So, a respective iteration of For Loop 520 may represent an instantaneous engine to generate an offset code based on temperature or supply voltage, which is supplied to a calibrator as the initialization code. Additionally or alternatively, respective offset codes generated by For Loop 520 over multiple respective iterations may be stored in a LUT (e.g., operation 408 of FIG. 4) and utilized to determine an offset code provided to the calibrator as the initialization code.

Figure 6:
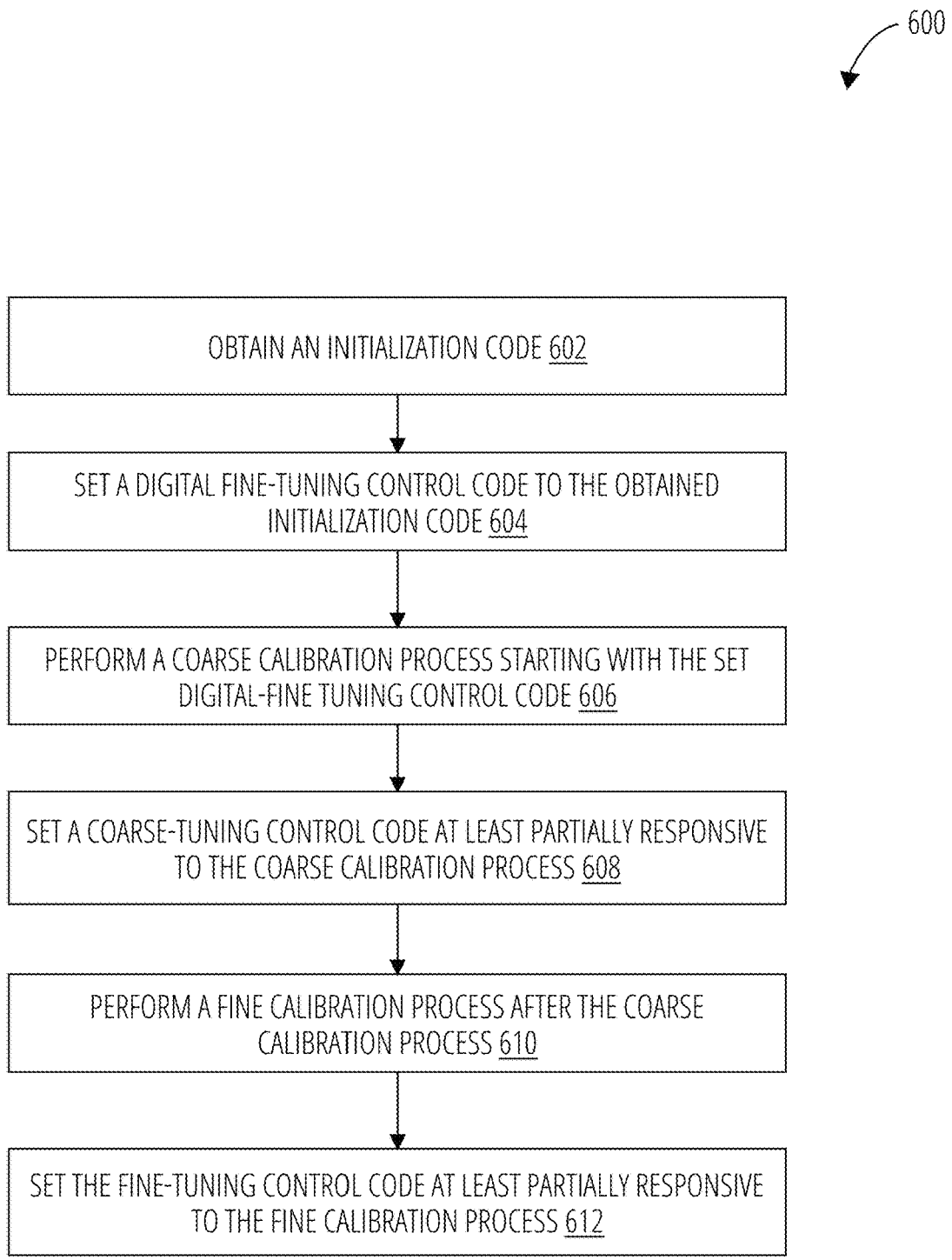
FIG. 6 is a flow diagram depicting a process to set an initial frequency of a tunable oscillator, in accordance with one or more examples.

FIG. 6 is a flow diagram depicting a process 600 to set an initial frequency of a tunable oscillator, in accordance with one or more examples.

Although the example process 600 depicts a particular sequence of operations, the sequence may be altered without departing from the scope of the present disclosure. For example, some of the operations depicted may be performed in parallel or in a different sequence that does not materially affect the function of the process 600. In other examples, different components of an example device or system that implements the process 600 may perform functions at substantially the same time or in a specific sequence.

In one or more examples, process 600 includes obtaining an initialization code at operation 602. In one or more examples, an initialization code may be obtained from an initializer 102 as discussed above.

In one or more examples, process 600 includes setting a digital fine-tuning control code to the obtained initialization code at operation 604. In one or more examples, the digital fine-tuning control code is set to the initialization code before performing coarse calibration or fine calibration.

In one or more examples, process 600 includes performing a coarse calibration process starting with the set digital-fine tuning control code at operation 606. As a non-limiting examples, during the coarse calibration process, a coarse-tuning control code may change until an output frequency is at, or close to, a target frequency, as a non-limiting example, within a quantization error of the tuning-elements in a coarse-tuning bank.

In one or more examples, process 600 includes setting a coarse-tuning control code at least partially responsive to the coarse calibration process at operation 608.

In one or more examples, process 600 includes performing a fine calibration process after the coarse calibration process at operation 610. As a non-limiting examples, during the fine calibration process, a fine-tuning control code may change until an output frequency is at, or close to, the target frequency, as a non-limiting example, within a quantization error of the tuning-elements in a fine-tuning bank.

In one or more examples, process 600 includes setting the fine-tuning control code at least partially responsive to the fine calibration process at operation 612.

Figure 7:
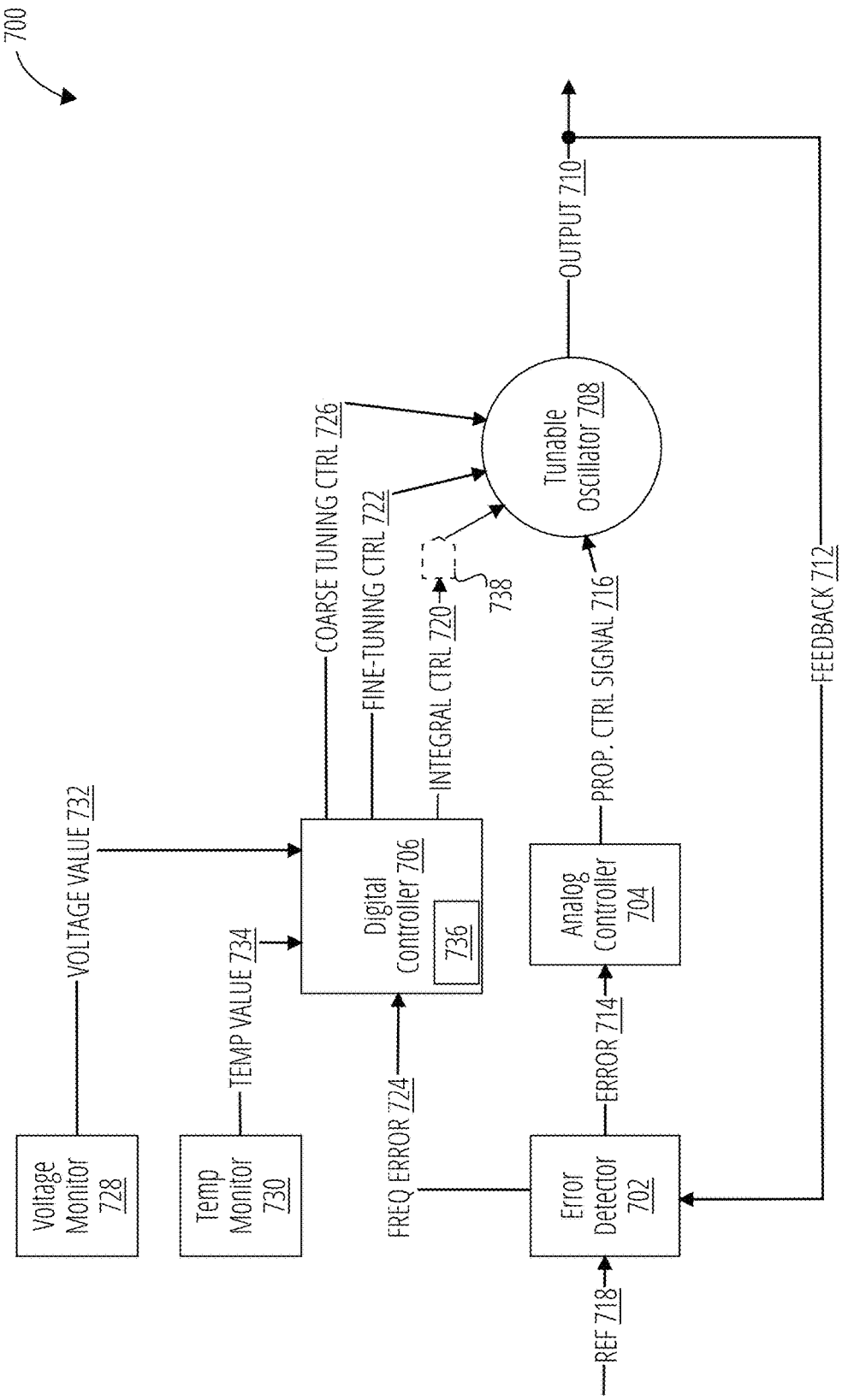
FIG. 7 is a block diagram depicting an apparatus to generate an output signal that tracks a reference signal, in accordance with one or more examples.

FIG. 7 is a block diagram depicting an apparatus 700 for generating an output clock signal that tracks a reference clock signal, in accordance with one or more examples.

Apparatus 700 includes: an error detector 702, a tunable oscillator 708, an analog controller 704, a digital controller 706, a voltage monitor 728, and a temperature monitor 730. In one or more examples, one or more of voltage monitor 728 and temperature monitor 730 may be on-chip. These components of apparatus 700 are arranged as a clock tracking circuit to generate an output clock signal that tracks a reference clock signal, and so apparatus 700 may also be referred to as "clock tracking circuit 700." Specifically, clock tracking circuit apparatus 700 is a hybrid clock tracking circuit that includes analog and digital control paths, as discussed below. As non-limiting examples, clock tracking circuit 700 may be a hybrid phase-locked loop (PLL), a hybrid delay locked loop (DLL), or a hybrid injection locked loop (ILL).

Various examples are not limited to hybrid or mixed-mode clock tracking circuits. In one or more, other examples, a clock tracking circuit may include just a digital control path and no analog control path. As a non-limiting example, use of pre-calibration techniques described herein with digitally-controlled clock tracking circuits such as a digital PLL, digital DLL, or digital ILL, is specifically contemplated.

Error detector 702 generates an error signal that includes information about the phase and frequency difference between two input signals. As non-limiting examples, error detector 702 may be or include one or more of: a phase-frequency detector, a bang-bang phase detector, a time-to-digital converter, a subsampling phase detector, or a combination or sub-combination of the same. Here, error detector 702 generates error signal 714, which includes information about the phase and frequency difference between reference clock signal 718 and feedback clock signal 712, and generates frequency error signal 724, which includes information about the frequency difference between reference clock signal 718 and feedback clock signal 712. Feedback clock signal 712 may be the same as output clock signal 710 (e.g., output clock signal 710 is provided directly to an input of error detector 702, without limitation), or may be a signal indicative of the phase or frequency of output clock signal 710, or a signal indicative thereof such as a frequency divided version of output clock signal 710, without limitation.

Analog controller 704 generates proportional control signal 716 for transient correction of phase differences between feedback clock signal 712 and reference clock signal 718 indicated by error signal 714. In one or more examples, proportional control signal 716 may be a voltage signal or a current signal depending on the control signal tunable oscillator 708 receives at its analog proportional control input.

Digital controller 706 generates coarse-tuning control code 726, fine-tuning control code 722, and integral control code 720 to urge an average frequency of tunable oscillator 708 toward a target frequency (e.g., a frequency of reference clock signal 718 or a multiple thereof, without limitation) in response to frequency differences between feedback clock signal 712 and reference clock signal 718 indicated by frequency error signal 724. Digital controller 706 includes fine-tuning control assist circuit 736 to assist with generation of fine-tuning control code 722 and coarse-tuning control code 726 based on voltage value 732 and temperature value 734. As non-limiting examples, fine-tuning control assist circuit 736 may be or include an apparatus 100, initializer 102, calibrator 108, calibrator 908, or initializer 936. Notably, the integral control code and proportional control signal are not changed while performing coarse and fine calibration.

Voltage value 732 is generated by voltage monitor 728, and represents a supply voltage, which may be on-chip, at a discrete time or time duration. Temperature value 734 is generated by on-chip temperature monitor 730, and represents on-chip temperature at a discrete time or time duration. In one or more examples, voltage monitor 728 and on-chip temperature monitor 730 may generate voltage value 732 and temperature value 734, respectively, to represent supply voltage and on-chip temperature for the same discrete time or time duration, or different discrete times or time durations. In one or more examples, on-chip temperature monitors 730 measures silicon die temperature at a location of its sensor (e.g., PN junction diode, without limitation). In one or more examples, the sensor of on-chip temperature monitor 730 is implemented on die located close (as a non-limiting example, as close as possible based on specific operating conditions) to the tunable oscillator.

Tunable oscillator 708 is an electronic oscillator that generates an output clock signal 710 at least partially in response to proportional control signal 716, integral control code 720, fine-tuning control code 722, and coarse-tuning control code 726. Tunable oscillator 708 includes an input for analog proportional control of tunable oscillator 708 (e.g., to receive proportional control signal 716 for voltage control of tunable oscillator 708, without limitation), an input for integral control of tunable oscillator 708 (e.g., to receive integral control code 720 or an integral control signal (voltage signal) generated by optional Digital-to-Analog Converter 738 in response to integral control code 720 for voltage control of tunable oscillator 708, without limitation), an input for digital coarse-tuning control of tunable oscillator 708 (e.g., to receive coarse-tuning control code 726 for digital or discrete control of tunable oscillator 708, without limitation), and an input for digital fine-tuning control of tunable oscillator 708 (e.g., to receive fine-tuning control code 722 for digital or discrete control of tunable oscillator 708, without limitation).

Figure 8:
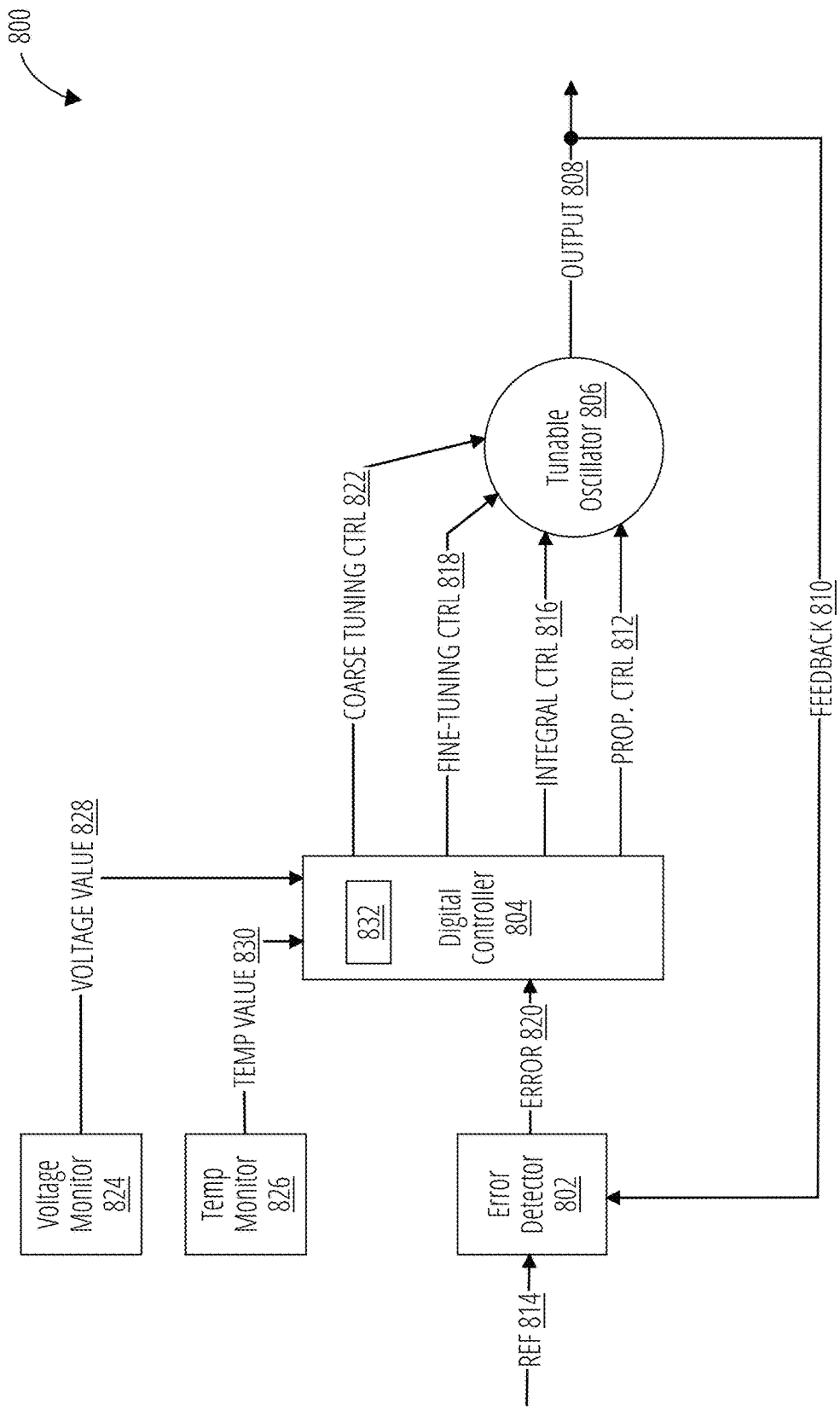
FIG. 8 is a block diagram depicting an apparatus to generate an output signal that tracks a reference signal, in accordance with one or more examples.

FIG. 8 is a block diagram depicting an apparatus 800 for generating an output clock signal that tracks a reference clock signal, in accordance with one or more examples.

Apparatus 800 includes: an error detector 802, a tunable oscillator 806, a digital controller 804, an voltage monitor 824, which may be an on-chip voltage monitor, and an on-chip temperature monitor 826. These components of apparatus 800 are arranged as a clock tracking circuit to generate an output clock signal that tracks a reference clock signal, and so apparatus 800 may also be referred to as "clock tracking circuit apparatus 800." Specifically, clock tracking circuit 800 is a digital PLL that includes digital control paths, as discussed below. Notably, clock tracking circuit 800 includes a digital control path and does not include an analog control path. As a non-limiting example, use of pre-calibration techniques described herein with digitally-controlled clock tracking circuits such as a digital PLL, digital DLL, or digital ILL, is specifically contemplated.

Except the proportional control signal 812 ("PROP. CTRL 812"), which is generated by digital controller 804 in response to error signal 820 ("ERROR 820"), like elements of FIG. 8 and FIG. 7 are the same and are not re-described. Notably, error signal 820 includes information about the phase and frequency difference between output clock signal 808 (or feedback clock signal 810, which is indicative of output clock signal 808) and reference clock signal 814, which is utilized by digital controller 804 to generate coarse-tuning control code 822, fine-tuning control code 818, integral control code 816, and proportional control signal 812.

Figure 9:
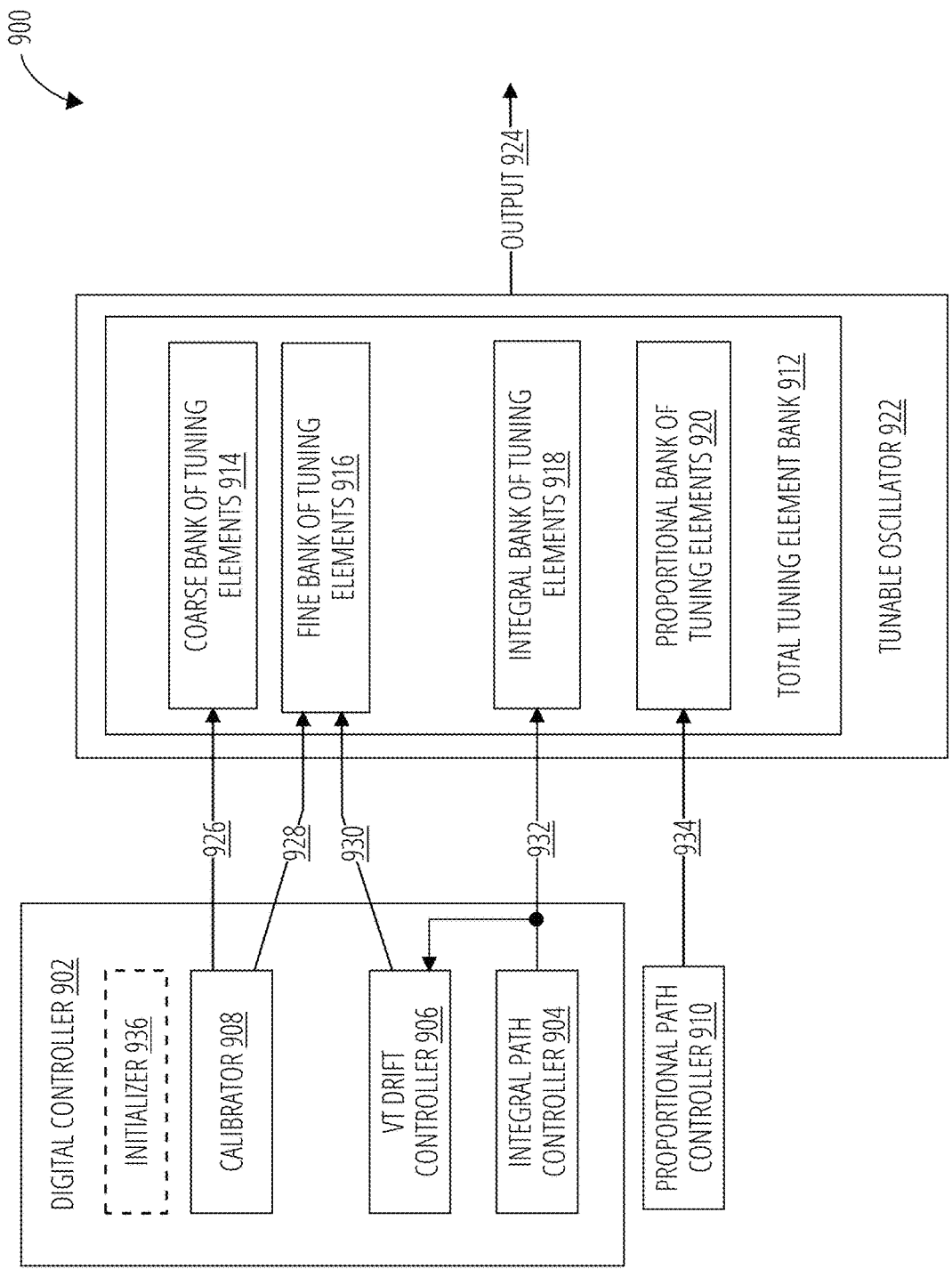
FIG. 9 is a block diagram of an apparatus to set a number of tuning-elements in a bank of tuning-elements of a tunable oscillator, for example, a fine bank of tuning-elements, in accordance with one or more examples.

FIG. 9 is a block diagram of an apparatus 900 to set a number of tuning-elements in a fine bank of tuning-elements of a tunable oscillator, in accordance with one or more examples.

Apparatus 900 includes digital controller 902 and tunable oscillator 922. Digital controller 902 is a non-limiting example of digital controller 706 of FIG. 7 or digital controller 804 of FIG. 8. In cases where proportional path controller 910 is implemented in an analog controller, proportional path controller 910 is a non-limiting example of analog controller 704. In cases where proportional path controller 910 is implemented in a digital controller, proportional path controller 910 is a non-limiting example of a logic circuit of digital controller 804.

Tunable oscillator 922 includes total tuning-element bank 912, which are the totality of tuning-elements in tunable oscillator 922. Generally speaking, tunable oscillator 922 generates output clock signal 924 exhibiting a phase and frequency at least partially responsive to the numbers of tuning-elements set at respective banks of tunable oscillator 922.

Total tuning-element bank 912 includes coarse bank of tuning-elements 914, fine bank of tuning-elements 916, integral bank of tuning-elements 918 and proportional bank of tuning-elements 920.

Coarse bank of tuning-elements 914 includes tuning-elements set via coarse-tuning control code 926 generated by calibrator 908. Coarse bank of tuning-elements 914 is utilized for coarse frequency calibration of tunable oscillator 922.

Fine bank of tuning-elements 916 includes tuning-elements set via fine-tuning control code 928 generated by calibrator 908 and further set by drift control code 930 of VT drift controller 906 as discussed below. Fine bank of tuning-elements 916 is utilized for fine frequency calibration of tunable oscillator 922 and for post-calibration drift compensation of tunable oscillator 922.

Integral bank of tuning-elements 918 includes tuning-elements set by integral control code 932 (or a voltage or current control signal generated from integral control code 932 e.g., by Digital-to-Analog Converter 738, as the case may be) generated by integral path controller 904. Integral bank of tuning-elements 918 is utilized to frequency lock tunable oscillator 922.

Proportional bank of tuning-elements 920 includes tuning-elements set by proportional control signal 934 generated by proportional path controller 910. Proportional bank of tuning-elements 920 is utilized to phase lock tunable oscillator 922.

The tuning-elements of respective banks of total tuning-element bank 912 may be the same or different. As a non-limiting example, in a case where proportional path controller 910 is an analog proportional controller the tuning-elements of proportional bank of tuning-elements 920 may be varactors whilst the tunings elements of one or more of coarse bank of tuning-elements 914, fine bank of tuning-elements 916, or integral bank of tuning-elements 918 may be capacitors or inductor-capacitor (LC) circuits. In examples where integral control code 932 is converted to an analog voltage or current control signal, the tuning-elements in integral bank of tuning-elements 918 may be varactors.

Digital controller 902 includes calibrator 908, VT drift controller 906 and integral path controller 904. Digital controller 902 optionally includes an initializer 936, which may be or include an initializer 102 of FIG. 1, as discussed above.

Calibrator 908 generates coarse-tuning control code 926 and fine-tuning control code 928, and may be or include, as a non-limiting example, a calibrator 108 of FIG. 1.

Integral path controller 904 generates integral control code 932 that is provided directly to a digital input of integral bank of tuning-elements 918 or, in one or more examples, is optionally converted to a voltage/current signal (e.g., by optional Digital-to-Analog Converter 738, without limitation). Integral path controller 904 is a non-limiting example of integral path controller of digital controller 706 of FIG. 7 or digital controller 804 of FIG. 8.

Proportional path controller 910 generates proportional control signal 934 and may be an analog controller (e.g., analog controller 704, without limitation) or a digital controller (e.g., part of digital controller 902, digital controller 706, or digital controller 804, without limitation).

In one or more examples, VT drift controller 906 receives integral control code 932 and generates drift control code 930. In one or more examples, drift control code 930 represents an amount by which the number of tuning-elements set at fine bank of tuning-elements 916 should be increased (tuning-elements are added to the bank) or decreased (tuning-elements are subtracted from the bank) to compensate (or at least partially compensate) for post-calibration drift at tunable oscillator 922.

In one or more examples, drift control code 930 may be an instruction to increment or decrement the number of tuning-elements set at fine bank of tuning-elements 916, where an increment instruction is an instruction to add a specified or pre-specified number (e.g., 1 tuning-element, without limitation) of tuning-elements to fine bank of tuning-elements 916, and a decrement instruction is an instruction to subtract a specified or pre-specified number (e.g., 1 tuning-element, without limitation) of tuning-elements to fine bank of tuning-elements 916. The specified or pre-specified number may be at least partially based on specific operation conditions, such as a limiting jitter at the PLL, without limitation.

In one or more examples, post-calibration drift of tunable oscillator 922 may be inferred by VT drift controller 906 at least partially based on integral control code 932 by VT drift controller 906.

Integral path controller 904 accumulates (or "integrates") frequency information but filters out rapid phase error information, hence the change in the frequency error signal is slower compared to the error signal utilized for proportional control, which responds faster to any phase error but detects very little frequency information from the error signal. Integral control code 932 represents the PLL's attempt to correct any gradual drift in average frequency. Stated another way, integral control code 932 is indicative of the magnitude of integral control action applied to the tunable oscillator to urge the oscillator frequency toward a target frequency.

The impact of post-calibration drift on tunable oscillator 922 is accumulated (or "integrated") as frequency drift error in integral control code 932. The digitally implemented integral path controller 904 has a limited range. If post-calibration drift is sufficiently large, it may saturate integral control code 932 (i.e., reach the upper or lower limit of values that can be represented by the code). VT drift controller 906 compares integral control code 932 with a first predetermined threshold value set near the upper limit of the range (e.g., ¾ of the full dynamic range, without limitation), and a second predetermined threshold value set near the lower limit of the range (e.g., ¼ of the full dynamic range, without limitation). If the integral control code 932 has accumulated "too much" frequency error information and reached the first or second predetermined threshold values, then the VT drift controller 906 generates drift control code 930 to add or subtract tuning-elements at fine bank of tuning-elements 916 in a manner proportional to drift control code 930. This relaxes the integral control code 932 and keeps it within the threshold limits.

In one or more examples, fine bank of tuning-elements 916 or tunable oscillator 922 more generally, may include a logic circuit that combines fine-tuning control code 928 provided by calibrator 908 and the drift control code 930 provided by VT drift controller 906 to generate a control code (or voltage/current signal) applied to the control input of fine bank of tuning-elements 916. For example, the logic circuit may utilize the fine-tuning control code 928 as a starting point and then track increment and decrement instructions of drift control code 930 to determine a number of tuning-elements and generate a control code to apply to fine bank of tuning-elements 916 that represents the determined number of tuning-elements.

Figure 10:
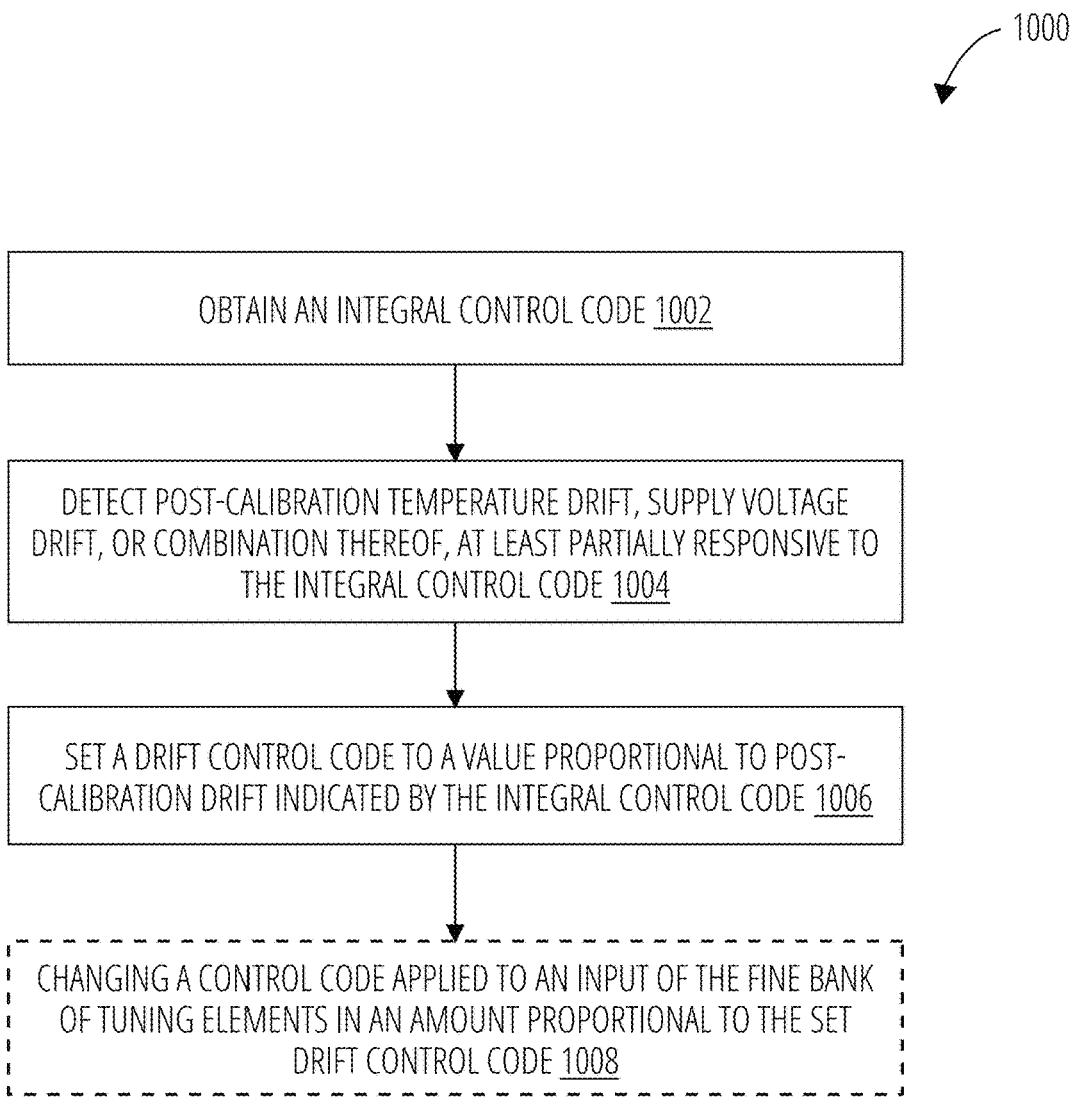
FIG. 10 is a flow diagram depicting a process to generate a control code to compensate for post-calibration drift at a tunable oscillator, in accordance with one or more examples.

FIG. 10 is a flow diagram depicting a process 1000 to generate a control code to compensate for post-calibration drift at a tunable oscillator, in accordance with one or more examples. As a non-limiting example, some or a totality of operations of process 1000 may be performed by VT drift controller 906 of FIG. 9.

Although the example process 1000 depicts a particular sequence of operations, the sequence may be altered without departing from the scope of the present disclosure. For example, some of the operations depicted may be performed in parallel or in a different sequence that does not materially affect the function of the process 1000. In other examples, different components of an example device or system that implements the process 1000 may perform functions at substantially the same time or in a specific sequence.

In one or more examples, process 1000 includes receiving an integral control code at operation 1002.

In one or more examples, process 1000 includes detecting post-calibration temperature drift, supply voltage drift, or combination thereof, at least partially responsive to the integral control code at operation 1004. In one or more examples, various states of the tunable oscillator that relate to post-calibration drift may be detected based on predetermined threshold values set near upper and lower limits of the range of the integral control code.

In one or more examples, process 1000 includes setting a drift control code to a value proportional to post-calibration drift indicated by the integral control code at operation 1006. In one or more examples, the value of the drift control code may indicate a number of tuning-elements to add to, or subtract from, the fine bank of tuning-elements. In one or more examples, the value of the drift control code may indicate an instruction to increment or decrement the number of tuning-elements set at the fine bank of tuning-elements. The amount to increment of decrement may be pre-specified or specified in the instruction.

In one or more examples, process 1000 includes changing a control code applied to an input of the fine bank of tuning-elements in an amount proportional to the set drift control code at operation 1008.

Figure 11:
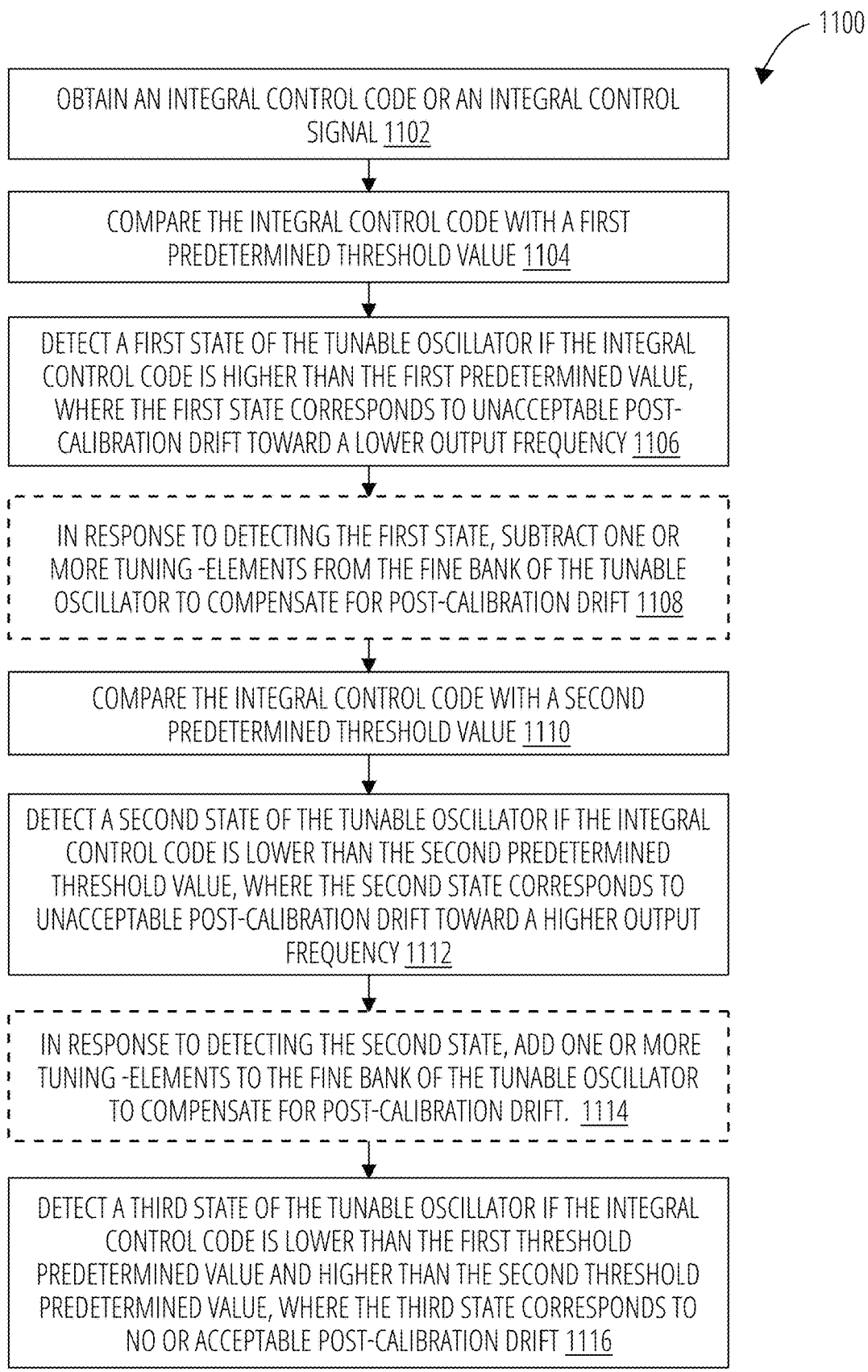
FIG. 11 is a flow diagram depicting a process for detecting a state of a tunable oscillator, and more specifically, a post-calibration drift state of a tunable oscillator, in accordance with one or more examples.

FIG. 11 is a flow diagram depicting a process 1100 for detecting a state of a tunable oscillator, and more specifically, a post-calibration drift state of a tunable oscillator, in accordance with one or more examples. Some or a totality of operations of process 1100 may be performed, as a non-limiting example, by VT drift controller 906 of FIG. 9.

Although the example process 1100 depicts a particular sequence of operations, the sequence may be altered without departing from the scope of the present disclosure. For example, some of the operations depicted may be performed in parallel or in a different sequence that does not materially affect the function of the process 1100. In other examples, different components of an example device or system that implements the process 1100 may perform functions at substantially the same time or in a specific sequence.

In one or more examples, process 1100 includes obtaining an integral control code or an integral control signal at operation 1102.

In one or more examples, process 1100 includes comparing the integral control code (e.g., digital code generated by integral path controller 904, without limitation) with a first predetermined threshold value at operation 1104. The first predetermined threshold value represents a conditions set close to an upper limit of the integral control code.

In one or more examples, process 1100 includes detecting a first state of the tunable oscillator if the integral control code or integral control signal is higher than the first predetermined threshold value at operation 1106. The first state corresponds to unacceptable post-calibration drift toward a lower oscillator frequency.

In one or more examples, process 1100 may optionally include, in response to detecting the first state, subtract one or more tuning-elements from the fine bank of the tunable oscillator to compensate for post-calibration drift at operation 1108. In one or more examples, a drift control code may include an instruction to decrement the number of tuning-elements in the fine-tuning bank of the tunable oscillator responsive to the first state. Subtracting a tuning-element from the fine bank increases the oscillator frequency.

In one or more examples, process 1100 includes comparing the integral control code or integral control signal with a second predetermined threshold value at operation 1110. The second predetermined threshold value represents a condition set close to a lower limit of the integral control code.

In one or more examples, process 1100 includes detecting a second state of the tunable oscillator if the integral control code or integral control signal is lower than the second predetermined threshold value. the second state corresponds to unacceptable post-calibration drift toward a higher oscillator frequency at operation 1112.

In one or more examples, process 1100 optionally includes, in response to detecting the second state, add one or more tuning-elements to the fine bank of the tunable oscillator to compensate for post-calibration drift at operation 1114. In one or more examples, the drift control code may include an instruction to increment the number of tuning-elements in the fine-tuning bank of the tunable oscillator responsive to the second state. Adding a tuning-element to the fine bank decreases the oscillator frequency.

In one or more examples, the method includes detecting a third state of the tunable oscillator if the integral control code or integral control signal is lower than the first predetermined value and higher than the second predetermined value. The third state corresponds to no, or acceptable, post-calibration drift at operation 1116, e.g., within an acceptable range where VT drift controller 906 will not act to compensate for post-calibration drift.

Process 1100 may detect a state of a tunable oscillator over multiple execution cycles where it detects the state and increments or decrements, as the case may be, the number of tuning-elements in the fine-tuning bank of the tunable oscillator until detecting the third state.

Process 1100 may generate a drift control code to subtract one or more tuning-elements from the fine bank of the tunable oscillator to increase the output frequency and lower the integral control code below the first predetermined threshold value. Process 1100 may generate a drift control code to add one or more tuning-elements to the fine bank of the tunable oscillator to decrease the output frequency and raising the integral control code above the second predetermined threshold value. Lowering the integral control code below the first predetermined threshold value and raising the integral control code above the second predetermined threshold value may occur at a predetermined rate so that the rate at which the number of set tuning-elements changes causes negligible or no jitter.

Figure 12:
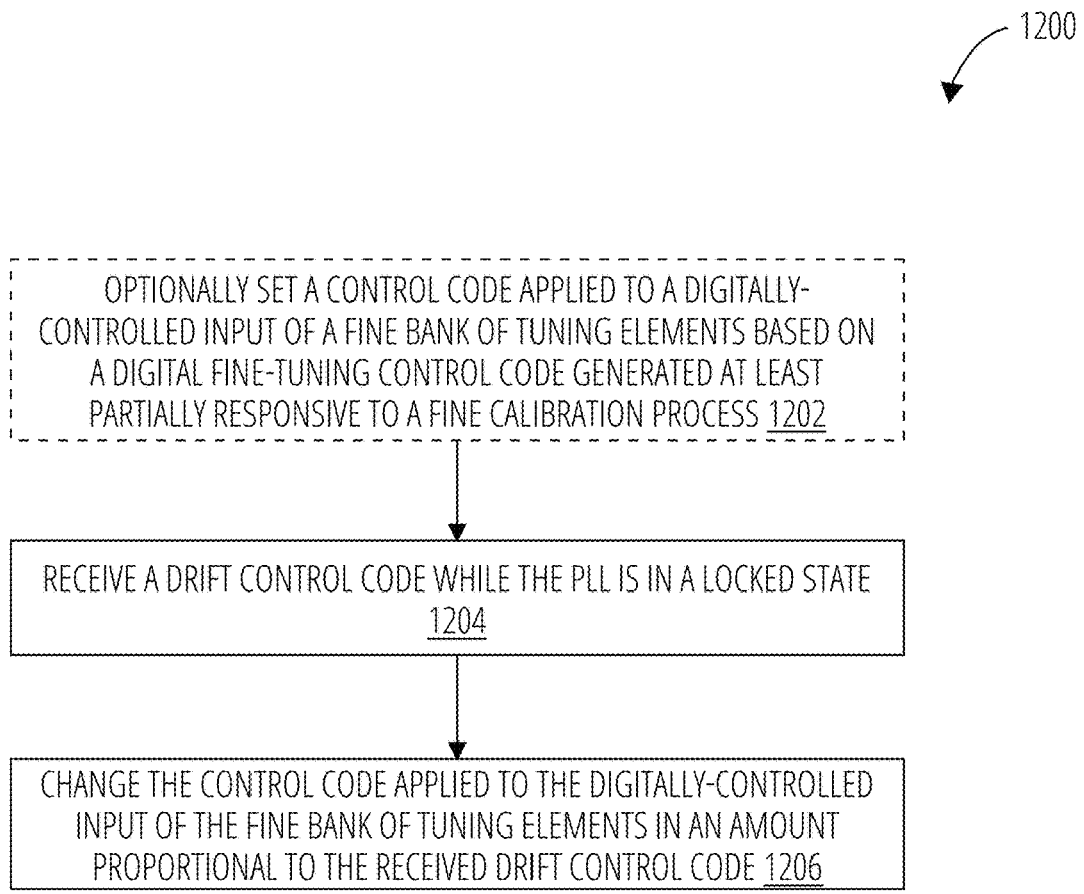
FIG. 12 is a flow diagram depicting a process to change a fine-tuning control code to compensate for post-calibration drift at a tunable oscillator, in accordance with one or more examples.

FIG. 12 is a flow diagram depicting a process 1200 to change a control code applied to an input of a fine bank of tuning-elements according to a drift control code to compensate for post-calibration drift at a tunable oscillator, in accordance with one or more examples. Some or a totality of operations of process 1200 may be performed, as a non-limiting example, by a logic circuit that generates/provides the control codes (e.g., at least partially based fine-tuning control code 122, fine-tuning control code 722, fine-tuning control code 818, fine-tuning control code 928, or integral control code 932, without limitation) applied to a digitally-controlled input of fine bank of tuning-elements 916.

Although the example process 1200 depicts a particular sequence of operations, the sequence may be altered without departing from the scope of the present disclosure. For example, some of the operations depicted may be performed in parallel or in a different sequence that does not materially affect the function of the process 1200. In other examples, different components of an example device or system that implements the process 1200 may perform functions at substantially the same time or in a specific sequence.

In one or more examples, the process 1200 optionally includes optionally setting a control code applied to a digitally-controlled input of a fine bank of tuning-elements based on a digital fine-tuning control code generated at least partially responsive to a fine calibration process at operation 1202. Operation 1202 may be considered optional in that it would be performed by a calibrator (e.g., calibrator 108 or calibrator 908, without limitation) in response to a fine calibration process, prior to a PLL being in a LOCKED state.

In one or more examples, process 1200 includes receiving a drift control code while the PLL is in a locked state at operation 1204. The drift control code may be generated by process 1000 or process 1100.

In one or more examples, process 1200 includes changing the control code applied to the digitally-controlled input of the fine bank of tuning-elements in an amount proportional to the received drift control code at operation 1206. In one or more examples, changes to the control code applied to the digitally-controlled input of the fine bank of tuning-elements made to compensate for post-calibration drift may occur over one or more execution cycles. Indeed, it may take multiple execution cycles to sufficiently compensate for post-calibration drift (e.g., output frequency is sufficient to maintain a locked state, without limitation).

Figure 13:
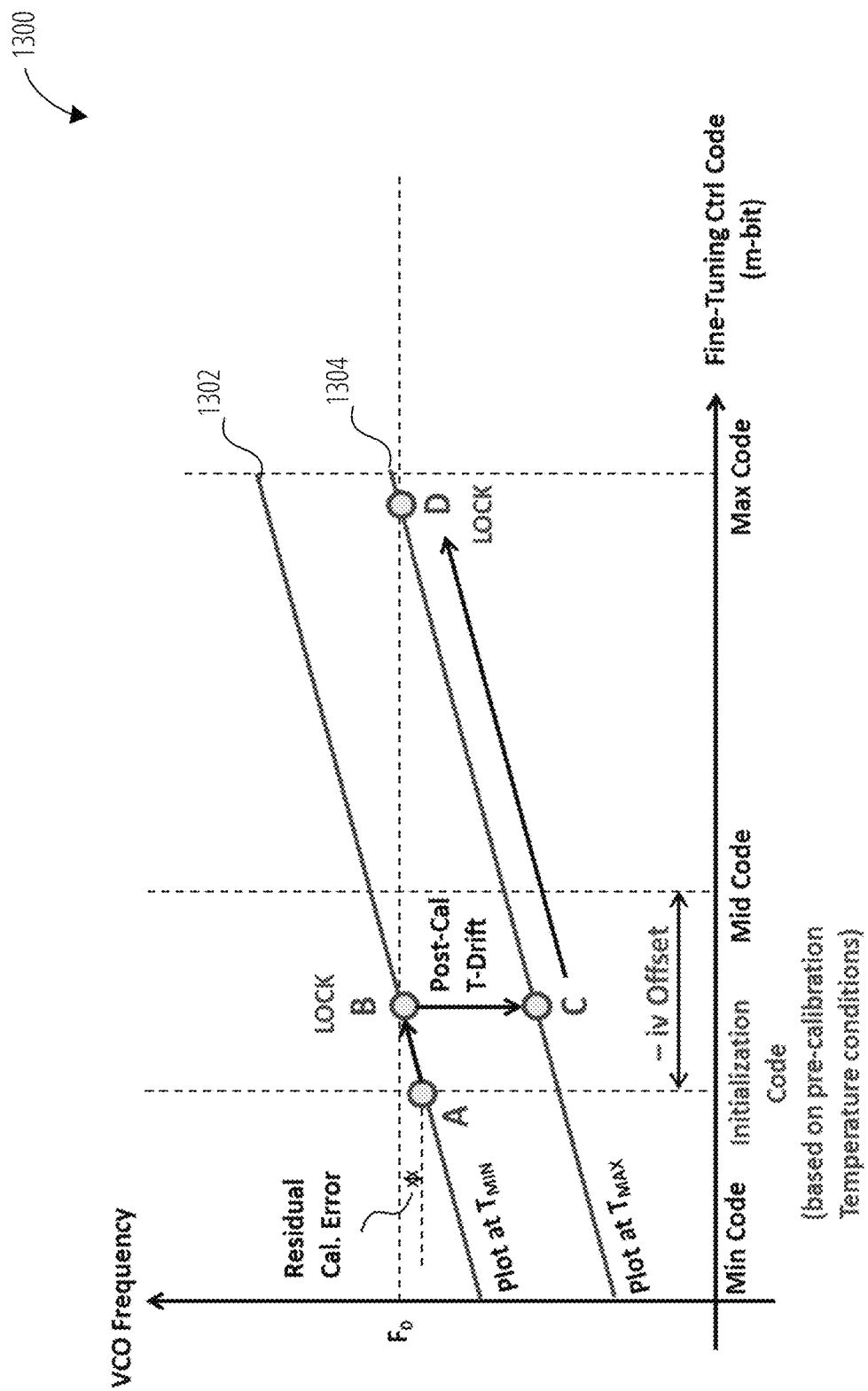
FIG. 13 is a graph that depicts initialization of a tunable oscillator and compensation for post-calibration of the tunable oscillator, in accordance with one or more examples.
Figure 14:
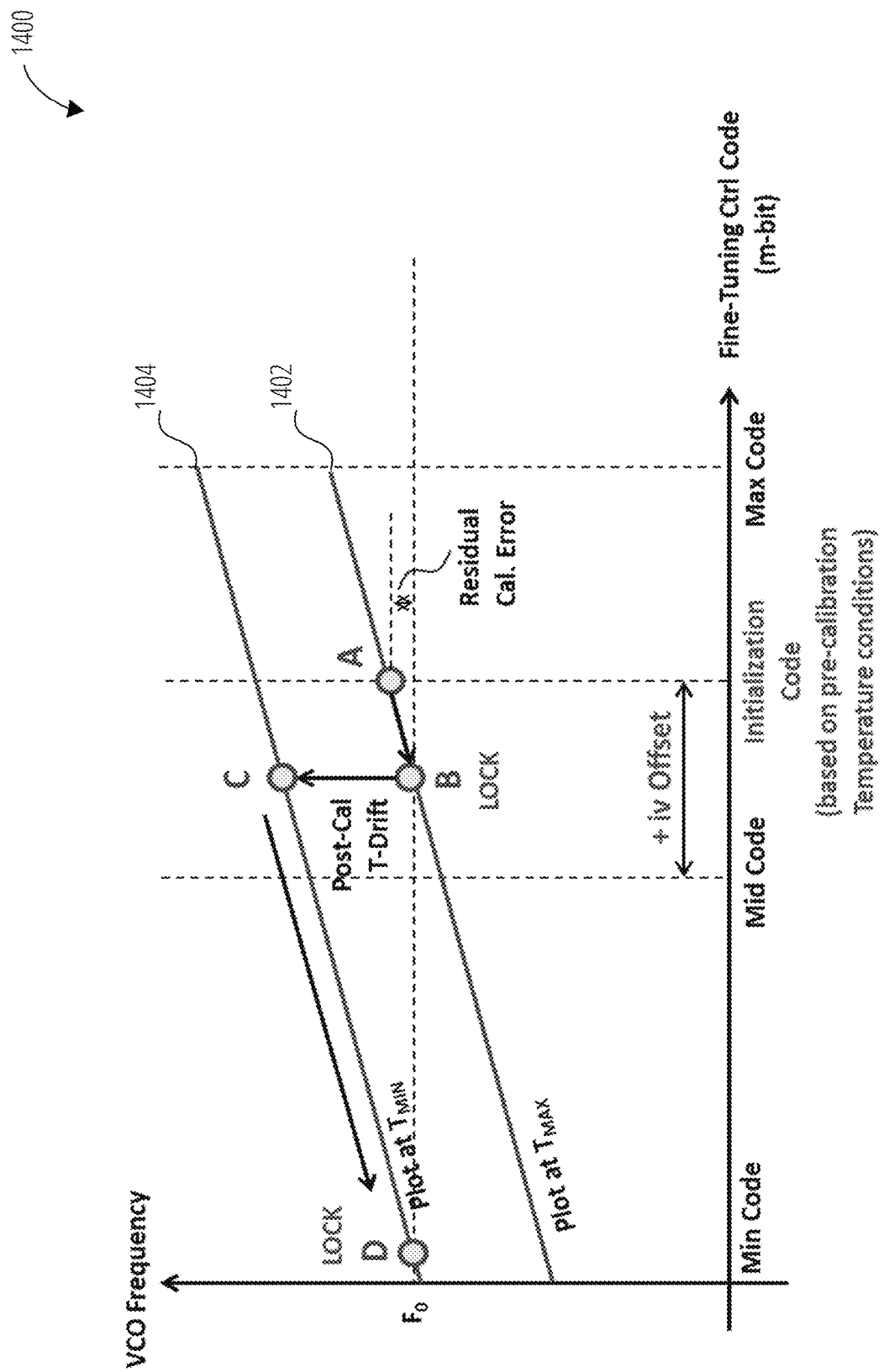
FIG. 14 is a graph that depicts initialization of a tunable oscillator and compensation for post-calibration of the tunable oscillator, in accordance with one or more examples.

FIG. 13 and FIG. 14 are graphs that depict initialization of a tunable oscillator and compensation for post-calibration drift of the tunable oscillator, in accordance with one or more examples. The initialization described with respect to FIG. 13 and FIG. 14 may be performed, as a non-limiting example, by apparatus 100 of FIG. 1 or apparatus 900 of FIG. 9. The compensation for post-calibration drift may be performed, as a non-limiting example, by apparatus 900 of FIG. 9.

For ease of discussion, the graphs of FIG. 13 and FIG. 14 show a specific non-limiting example case solely for temperature drift. An example case of supply voltage drift could be given by replacing the word "temperature" with "supply voltage" in the description below.

The graphs of FIG. 13 and FIG. 14 are simplified examples of temperature aware initialization and illustrate example advantages, and do not necessarily show actual close loop behavior of PLLs.

FIG. 13 is a graph 1300 depicting relationships between values of fine-tuning control codes and output frequency of a tunable oscillator before (line 1302) and after (line 1304) the tunable oscillator (or PLL including the same), calibrated via temperature or voltage initialization, experiences post-calibration drift. In the example depicted by FIG. 13, the initialization code is set toward the lower end (toward "Min Code") of the range of the fine-tuning control code, corresponding to a predetermined low or minimum pre-calibration temperature.

The horizontal axis represents M-bit codes of a fine-tuning control code increasing from a minimum code (Min Code) on the left to a maximum code (Max Code) on the right. The vertical axis represents a frequency of a tunable oscillator (VCO Frequency) increasing from the bottom toward the top of the vertical axis. Line 1302 represents a frequency response of a tunable oscillator to various M-bit codes of the fine-tuning control code after temperature or supply voltage based initialization, but before experiencing post-calibration drift. Line 1304 represents a frequency response of a tunable oscillator to various M-bit codes of the fine-tuning control code after experiencing post-calibration drift.

Point A on line 1302 represents the frequency of the tunable oscillator at an M-bit code set after performing coarse calibration that started at the initialization code (i.e., set by subtracting an Offset Code from a Mid Code, as discussed above). Point A on line 1302 represents the frequency of the tunable oscillator at the end of coarse calibration step. Point B on line 1302 represents the frequency of the tunable oscillator at an M-bit code set in response to performing fine calibration, which, in this non-limiting example, corresponds to a locked state of a PLL.

Frequency $F_O$ on the vertical axis represents the target output frequency of the tunable oscillator. Pre-calibration initialization sets the M-bit fine-tuning control code at the point marked 'Initialization Code' on horizontal axis (i.e., set by subtracting Offset Code from a Mid-Code, as discussed above) corresponding to the pre-calibration temperature. Coarse calibration starts with the initialized fine-tuning control code. The difference between frequency $F_O$ and frequency at Point A is the residual coarse calibration error, which is substantially corrected by the fine calibration process. Point B on line 1302 represents the frequency of the tunable oscillator at the end of the fine calibration, which, in this non-limiting example, also corresponds to a LOCK state of a PLL.

Point C on line 1304 represents the frequency of the tunable oscillator at the same M-bit code as Point B, but after experiencing post-calibration drift. Notably, the frequency at Point C is on line 1304 and is different than the frequency at Point B on line 1302. At Point C, the PLL is potentially not in a locked state.

Point D on line 1304 represents the frequency of the tunable oscillator at an M-bit code set by a VT drift algorithm (discussed above) after experiencing temperature or voltage drift. Notably, the frequency at point D on line 1304 is substantially the same as the frequency at point B on line 1302, and in this non-limiting example corresponds to a locked state of the PLL. The PLL will try to keep the output frequency at frequency $F_O$ and maintain locked state even after post-calibration drift. The PLL will generate a large frequency error signal and try to compensate this drift using the integral (and proportional) control code, until the integral control code saturates. FIG. 13 illustrates the frequency error in terms of frequency shift from Point B to Point C, solely for ease of explanation.

If Mid Code had been utilized to calibrate to target frequency $F_O$, then upon VT drift compensation at point D may not have been close enough to the target frequency $F_O$ to guarantee re-LOCK of the PLL at a code less than or equal Max Code.

FIG. 14 is a graph 1400 depicting relationships between values of fine-tuning control codes and output frequency of a tunable oscillator before (line 1402) and after (line 1404) the tunable oscillator (or PLL including the same), calibrated via temperature or voltage initialization, experiences post-calibration drift. In the example depicted by FIG. 14, the initialization code is set toward the higher end (toward "Max Code") of the range of the fine-tuning control code, corresponding to a predetermined high or maximum pre-calibration temperature.

The horizontal axis represents M-bit codes of a fine-tuning control code increasing from a minimum code (Min Code) on the left to a maximum code (Max Code) on the right. The vertical axis represents a frequency of a tunable oscillator (VCO Frequency) increasing from the bottom toward the top of the vertical axis. Line 1402 represents a frequency response of the tunable oscillator to various M-bit codes of the fine-tuning control code after temperature and supply voltage based initialization, but before experiencing post-calibration drift. Line 1404 represents the frequency response of the tunable oscillator to various M-bit codes of the fine-tuning control code after experiencing post-calibration drift.

Point A on line 1402 represents the frequency of the tunable oscillator at an M-bit code set after performing coarse calibration that started at an the initialization code (i.e., set by adding an Offset Code with a Mid Code, as discussed above). Point B on line 1402 represents the frequency of the tunable oscillator at an M-bit code set in response to performing fine calibration, which, in this non-limiting example, corresponds to a locked state of a PLL.

Frequency $F_O$ on the vertical axis represents the target output frequency of the tunable oscillator. Pre-calibration initialization sets the M-bit fine-tuning control code at the point marked 'Initialization Code' on horizontal axis (i.e., set by adding Offset Code from a Mid-Code, as discussed above) corresponding to the pre-calibration temperature. Coarse calibration starts with the initialized fine-tuning control code. The difference between frequency $F_O$ and the frequency corresponding to Point A on line 1402 is the residual coarse calibration error, which is substantially corrected by the fine calibration process. Point B on line 1402 represents the frequency of the tunable oscillator at the end of the fine calibration, which, in this non-limiting example, also corresponds to a LOCK state of a PLL.

Point C on line 1404 represents the frequency of the tunable oscillator at the same M-bit code set in response to performing fine calibration, but after experiencing post-calibration drift. Notably, the frequency at Point C on line 1404 and is different than the frequency at Point B on line 1402. At Point C, the PLL is potentially not in a locked state. The PLL will try to keep the output frequency at frequency $F_O$ and maintain locked state even after post-calibration drift. The PLL will generate a large frequency error signal and try to compensate this drift using the integral (and proportional) control code, until the integral control code saturates. FIG. 14 illustrates the frequency error in terms of frequency shift from Point B to Point C, solely for ease of explanation.

Point D on line 1404 represents the frequency of the tunable oscillator at an M-bit code set by a VT drift algorithm (discussed above) after experiencing post-calibration drift. Notably, the frequency at Point D on line 1404 is substantially the same as the frequency at Point B on line 1402, and in this non-limiting example corresponds to a locked state of the PLL.

If Mid Code had been utilized to calibrate to target frequency $F_O$, then upon VT drift compensation at point D may not have been close enough to the target frequency $F_O$ to guarantee re-LOCK of the PLL at a code greater than or equal Min Code.

Figure 15:
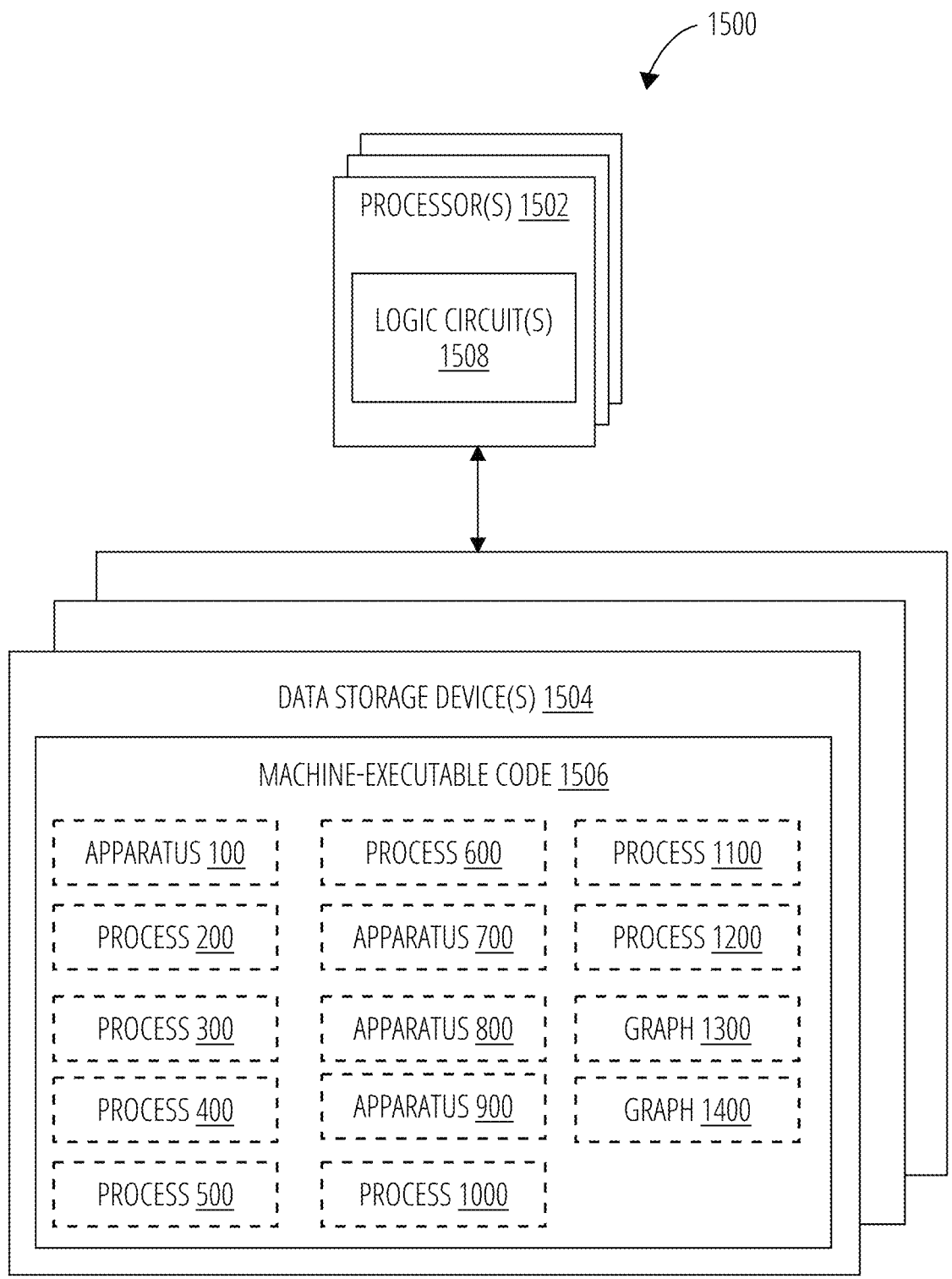
FIG. 15 is a block diagram of a circuitry that, in one or more examples, may be used to implement various functions, operations, acts, processes, or methods disclosed herein.

FIG. 15 is a block diagram of a circuitry 1500 that, in one or more examples, may be used to implement various functions, operations, acts, processes, or methods disclosed herein. Circuitry 1500 includes one or more processors 1502 (sometimes referred to herein as "processors 1502") operably coupled to one or more apparatuses such as data storage devices (sometimes referred to herein as "storage 1504"), without limitation. Storage 1504 includes machine-executable code 1506 stored thereon (e.g., stored on a computer-readable memory, without limitation) and processors 1502 include logic circuit(s) 1508. Machine-executable code 1506 include information describing functional elements that may be implemented by (e.g., performed by) logic circuit(s) 1508. Logic circuit(s) 1508 is implements (e.g., performs) the functional elements described by machine-executable code 1506. Circuitry 1500, when executing the functional elements described by machine-executable code 1506, should be considered as special purpose hardware may carry out the functional elements disclosed herein. In one or more examples, processors 1502 may perform the functional elements described by machine-executable code 1506 sequentially, concurrently (e.g., on one or more different hardware platforms), or in one or more parallel process streams.

When implemented by logic circuit(s) 1508 of processors 1502, machine-executable code 1506 may adapt processors 1502 to perform operations of examples disclosed herein. For example, machine-executable code 1506 may adapt processors 1502 to perform at least some or a totality of the operations of process 200, process 300, process 400, process 500, process 600, process 1000, process 1100, or process 1200, or of the example processes discussed with respect to graph 1300 or graph 1400. As another example, machine-executable code 1506 may adapt processors 1502 to perform at least some or a totality of the features or functions discussed for apparatus 100, apparatus 700, apparatus 800, or apparatus 900, and more specifically, one or more of initializer 102, offset code 104, calculation logic 106, calibrator 108, coarse calibration logic 112, fine calibration logic 110, temperature value 114 of FIG. 1; error detector 702, analog controller 704, digital controller 706, fine-tuning control assist circuit 736, tunable oscillator 708, on-chip voltage monitor 728, or on-chip temperature monitor 730 of FIG. 7; error detector 802, digital controller 804, tunable oscillator 806, on-chip temperature monitor 826, on-chip voltage monitor 824, fine-tuning control assist circuit 832 of FIG. 8; or digital controller 902, integral path controller 904, VT drift controller 906, calibrator 908, tunable oscillator 922, total tuning-element bank 912, coarse bank of tuning-elements 914, fine bank of tuning-elements 916, integral bank of tuning-elements 918, or proportional bank of tuning-elements 920 of FIG. 9.

Processors 1502 may include a general purpose processor, a special purpose processor, a central processing unit (CPU), a microcontroller, a programmable logic controller (PLC), a digital signal processor (DSP), an integrated circuit (IC), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer executes computing instructions (e.g., software code, without limitation) related to examples. It is noted that a general-purpose processor (may also be referred to herein as a host processor or simply a host) may be a microprocessor, but in the alternative, processors 1502 may include any conventional processor, controller, microcontroller, or state machine. Processors 1502 may also be implemented as a combination of computing devices, such as a combination of a DSP and a microprocessor, a plurality of microprocessors, one or more microprocessors in conjunction with a DSP core, or any other such configuration.

In one or more examples, storage 1504 includes volatile data storage (e.g., random-access memory (RAM), without limitation), non-volatile data storage (e.g., Flash memory, a hard disc drive, a solid-state drive, erasable programmable read-only memory (EPROM), without limitation). In one or more examples processors 1502 and storage 1504 may be implemented into a single device (e.g., a semiconductor device product, a system on chip (SOC), without limitation). In one or more examples processors 1502 and storage 1504 may be implemented into separate devices.

In one or more examples, machine-executable code 1506 may include executable instructions (e.g., software code, firmware code, computer-readable instructions more generally, without limitation). By way of non-limiting example, the executable instructions may be stored by storage 1504, accessed directly by processors 1502, and executed by processors 1502 using at least logic circuit(s) 1508. Also, by way of non-limiting example, the executable instructions may be stored on storage 1504, transmitted to a memory device (not shown) for execution, and executed by processors 1502 using at least logic circuit(s) 1508. Accordingly, in one or more examples logic circuit(s) 1508 includes electrically configurable logic circuitry.

In one or more examples, machine-executable code 1506 may describe hardware (e.g., circuitry, without limitation) to be implemented in logic circuit(s) 1508 to perform the functional elements. This hardware may be described at any of a variety of levels of abstraction, from low-level transistor layouts to high-level description languages. At a high-level of abstraction, a hardware description language (HDL) such as an Institute of Electrical and Electronics Engineers (IEEE) Standard hardware description language (HDL) may be used, without limitation. By way of non-limiting examples, Verilog™, SystemVerilog™ or very large scale integration (VLSI) hardware description language (VHDL™) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of logic circuit(s) 1508 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in one or more examples machine-executable code 1506 may include an HDL, an RTL, a GL description, a mask level description, other hardware description, or any combination thereof.

In examples where machine-executable code 1506 includes a hardware description (at any level of abstraction), a system (not shown, but including storage 1504) may implement the hardware description described by machine-executable code 1506. By way of non-limiting example, processors 1502 may include a programmable logic device (e.g., an FPGA or a PLC, without limitation) and the logic circuit(s) 1508 may be electrically controlled to implement circuitry corresponding to the hardware description into logic circuit(s) 1508. Also by way of non-limiting example, logic circuit(s) 1508 may include hard-wired logic manufactured by a manufacturing system (not shown, but including storage 1504) according to the hardware description of machine-executable code 1506.

Regardless of whether machine-executable code 1506 includes executable instructions or a hardware description, logic circuit(s) 1508 performs the functional elements described by machine-executable code 1506 when implementing the functional elements of machine-executable code 1506. It is noted that although a hardware description may not directly describe functional elements, a hardware description indirectly describes functional elements that the hardware elements described by the hardware description are capable of performing.

In one or more examples discussed, above, the relationship between output frequency and temperature, supply voltage, and combinations thereof, are generally assumed to be a direct relationship, but the examples and techniques for supply voltage based and temperature based fine control of a tunable oscillator discussed herein are not limited to a direct relationship between output frequency and temperature, supply voltage, and combinations thereof. As a non-limiting example, it is specifically contemplated that the relationship may be inverse instead of direct. The offset_code can be generated for any combination of supply voltage and temperature (VmaxTmax, VmaxTmin, VminTmax, VminTmin, any intermediate values, and any combination or subcombination of values thereof). As a non-limiting example, when temperature is high and voltage is constant, some types of delay tuning-elements may exhibit longer delay, which decreases output frequency of a tunable oscillator. As long as the relationship, direct or inverse, is known in advance, then the effect of addition or subtraction of tuning-elements on output frequency can be known, and the decision whether to add or subtract tuning-elements can be made accordingly, e.g., by an initializer, calibrator, or VT drift controller, without limitation.

As used herein, the term "substantially" in reference to a given parameter, property, or condition means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, or even at least about 99% met.

As used in the present disclosure, the terms "module" or "component" may refer to specific hardware implementations may perform the actions of the module or component or software objects or software routines that may be stored on or executed by general purpose hardware (e.g., computer-readable media, processing devices, without limitation) of the computing system. In one or more examples, the different components, modules, engines, and services described in the present disclosure may be implemented as objects or processes that execute on the computing system (e.g., as separate threads, without limitation). While some of the system and methods described in the present disclosure are generally described as being implemented in software (stored on or executed by general purpose hardware), specific hardware implementations or a combination of software and specific hardware implementations are also possible and contemplated.

As used in the present disclosure, the term "combination" with reference to a plurality of elements may include a combination of all the elements or any of various different sub-combinations of some of the elements. For example, the phrase "A, B, C, D, or combinations thereof" may refer to any one of A, B, C, or D; the combination of each of A, B, C, and D; and any sub-combination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," without limitation). As used herein, "each" means "some or a totality." As used herein, "each and every" means "a totality."

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" or "an" means "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, without limitation" or "one or more of A, B, and C, without limitation." is used, in general such a construction is intended to include A alone, B alone, C alone, A and B together, A and C together, B and C together, or A, B, and C together, without limitation.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additional non-limiting examples of the disclosure may include:

Example 1: A method, comprising: receiving one or more values indicative of temperature or supply voltage of a phase-locked loop (PLL); setting a digital fine-tuning control code to an initialization code, the initialization code at least partially based on the received one or more values indicative of temperature or supply voltage of the PLL, wherein the digital fine-tuning control code is for setting a number of tuning-elements within a fine bank of a tunable oscillator; and starting a calibration of the PLL with the set digital fine-tuning control code, the calibration to set an initial frequency of the oscillator at or close to a target frequency.

Example 2: The method according to Example 1, wherein setting the digital fine-tuning control code to the initialization code comprises: obtaining an offset code associated with the received one or more values indicative of temperature or supply voltage of the phase-locked loop (PLL); setting the initialization code to one-half (½) range of the digital fine-tuning control code; and changing the set initialization code by an amount represented by the offset code.

Example 3: The method according to any of Examples 1 and 2, wherein setting the digital fine-tuning control code to the initialization code comprises: setting the digital fine-tuning control code to the changed set initialization code.

Example 4: The method according to any of Examples 1 through 3, comprising: obtaining parameters representing a frequency response of the tunable oscillator to changes in supply voltage and temperature, and predetermined ranges of temperature and supply voltage; determining a number of tuning-elements within a fine-tuning bank of a tunable oscillator; determining respective frequencies of the tunable oscillator in response to respective temperature values and respective supply voltage values, and determining respective offset codes to compensate for the determined frequencies utilizing the tuning-elements within the fine-tuning bank of the tunable oscillator; and storing the determined offset codes in a look-up table or utilizing a determined offset code to determine the initialization code.

Example 5: The method according to any of Examples 1 through 4, comprising: performing a coarse calibration process starting with the set digital-fine tuning control code; setting a coarse-tuning control code at least partially responsive to the coarse calibration process; performing a fine calibration process after the coarse calibration process; and setting the fine-tuning control code at least partially responsive to the fine calibration process.

Example 6: The method according to any of Examples 1 through 5, comprising: obtaining an integral control code; detecting post-calibration temperature drift, supply voltage drift, or combination thereof, at least partially responsive to the integral control code; and set a drift control code to a value proportional to post-calibration drift indicated by the integral control code.

Example 7: The method according to any of Examples 1 through 6, comprising: change a control code applied to an input of the fine bank of tuning-elements in an amount proportional to the set drift control code.

Example 8: The method according to any of Examples 1 through 7, wherein the detecting post-calibration drift comprises: compare the integral control code with a first predetermined threshold value; detect a first state of the tunable oscillator if the integral control code is higher than the first predetermined value, wherein the first state corresponds to unacceptable post-calibration drift toward a lower output frequency; compare the integral control code with a second predetermined threshold value; detect a second state of the tunable oscillator if the integral control code is lower than the second predetermined threshold value, wherein the second state corresponds to unacceptable post-calibration drift toward a higher output frequency; and detect a third state of the tunable oscillator if the integral control code is lower than the first threshold predetermined value and higher than the second threshold predetermined value, wherein the third state corresponds to no or acceptable post-calibration drift.

Example 9: The method according to any of Examples 1 through 8, wherein the PLL includes a digital integral and digital proportional control paths.

Example 10: The method according to any of Examples 1 through 9, wherein the PLL includes a digital integral control path and an analog proportional control path.

Example 11: An apparatus, comprising: a processor; and a data storage device to store machine-executable code including executable instructions to adapt or enable the processor to: receive one or more values indicative of temperature or supply voltage of a phase-locked loop (PLL); set a digital fine-tuning control code to an initialization code, the initialization code at least partially based on the received one or more values indicative of temperature or supply voltage of the PLL, wherein the digital fine-tuning control code for setting a number of tuning-elements within a fine bank of a tunable oscillator; and start calibration of the PLL with the set digital fine-tuning control code.

Example 12: The apparatus according to Example 11, wherein the machine-executable code including executable instructions to adapt or enable the processor to: obtain an offset code associated with the received one or more values indicative of temperature or supply voltage of the phase-locked loop (PLL); set the initialization code to one-half (½) range of the digital fine-tuning control code; and change the set initialization code by an amount represented by the offset code.

Example 13: The apparatus according to any of Examples 11 and 12, wherein the executable instructions to adapt or enable the processor to set the digital fine-tuning control code to the initialization code comprise executable instructions to: set the digital fine-tuning control code to the changed set initialization code.

Example 14: The apparatus according to any of Examples 11 through 13, wherein the machine-executable code including executable instructions to adapt or enable the processor to: obtain parameters representing a frequency response of the tunable oscillator to changes in supply voltage and temperature, and predetermined ranges of temperature and supply voltage; determine a number of tuning-elements within a fine-tuning bank of a tunable oscillator; determine respective frequencies of the tunable oscillator in response to respective temperature values and respective supply voltage values, and determine respective offset codes to compensate for the determined frequencies utilizing the tuning-elements within the fine-tuning bank of the tunable oscillator; and store the determined offset codes in a look-up table or utilizing the determined offset codes as the initialization code.

Example 15: The apparatus according to any of Examples 11 through 14, wherein the machine-executable code including executable instructions to adapt or enable the processor to: perform a coarse calibration process starting with the set digital-fine tuning control code; set a coarse-tuning control code at least partially responsive to the coarse calibration process; perform a fine calibration process after the coarse calibration process; and set the fine-tuning control code at least partially responsive to the fine calibration process.

Example 16: The apparatus according to any of Examples 11 through 15, wherein the machine-executable code including executable instructions to adapt or enable the processor to: obtain an integral control code; detect post-calibration drift at least partially responsive to changes in the integral control code; and set a drift control code to a value proportional to post-calibration drift indicated by changes in the integral control code.

Example 17: The apparatus according to any of Examples 11 through 16, wherein the machine-executable code including executable instructions to adapt or enable the processor to: changing the fine-tuning control code having been set responsive to a fine calibration process in an amount proportional to the set drift control code.

Example 18: An apparatus comprising: a tunable oscillator to generate an output signal; an error detector to generate an error signal indicative of a phase or frequency difference between the output signal and a reference signal; a voltage monitor to generate a value representative of a supply voltage of the apparatus; a temperature monitor to generate a value representative of the temperature of the apparatus; one or more controllers to provide to the tunable oscillator: a proportional control signal to the tunable oscillator least partially responsive to the error signal generated by the error detector; an integral control code or an integral control signal; a coarse-tuning control code; and a fine-tuning control code, wherein the one or more controller to set the fine-tuning control code at least partially responsive to one or more of the values respectively representative of the supply voltage of the apparatus or the temperature of the apparatus.

Example 19: The apparatus according to Example 18, wherein the integral control code or the integral control signal is indicative of magnitude of integral control action applied to the tunable oscillator to urge the tunable oscillator frequency toward a target frequency.

Example 20: The apparatus according to any of Examples 18 and 19, comprising: an analog controller of the one or more controllers, the analog controller to provide the proportional control signal; and a digital controller of the one or more controllers, the digital controller to provide the integral control code or an integral control signal, the coarse-tuning control code, and the fine-tuning control code.

Example 21: The apparatus according to any of Examples 18 through 20, comprising a digital controller of the one or more controllers, the digital controller to provide: the proportional control signal, the integral control code or an integral control signal, the coarse-tuning control code, and the fine-tuning control code.

While the present disclosure has been with respect to certain illustrated examples, those of ordinary skill in the art will recognize and appreciate that the present invention is not so limited. Rather, many additions, deletions, and modifications to the illustrated and described examples may be made without departing from the scope of the invention as hereinafter claimed along with their legal equivalents. In addition, features from one example may be combined with features of another example while still being encompassed within the scope of the invention as contemplated by the inventor.

What is claimed is:

1. A method, comprising:
    receiving values indicative of temperature of a tunable oscillator and supply voltage of a phase-locked loop (PLL);
    setting a digital fine-tuning control code based on an initialization code, the initialization code at least partially based on the received values indicative of one or more of a temperature value of the tunable oscillator and a supply voltage value of the PLL, wherein the digital fine-tuning control code is to set a number of tuning-elements within a fine bank of the tunable oscillator; and
    starting a calibration of the PLL with the set digital fine-tuning control code, the calibration to set an initial frequency of the tunable oscillator at or close to a target frequency, wherein the PLL includes a digital integral control path and proportional control paths.

2. The method of claim 1, wherein setting the digital fine-tuning control code to the initialization code comprises:
    obtaining an offset code associated with the received values indicative of one or more of a temperature value of the tunable oscillator and supply voltage of the PLL;
    setting the initialization code to one-half (½) range of the digital fine-tuning control code; and
    changing the set initialization code by an amount represented by the offset code.

3. The method of claim 2, wherein setting the digital fine-tuning control code to the initialization code comprises:
    setting the digital fine-tuning control code to the changed set initialization code.

4. The method of claim 1, comprising:
    obtaining parameters representing a frequency response of the tunable oscillator to changes in supply voltage and temperature, and predetermined ranges of temperature and supply voltage;
    determining a number of tuning-elements within a fine-tuning bank of a tunable oscillator;
    determining respective frequencies of the tunable oscillator in response to respective temperature values and respective supply voltage values, and determining respective offset codes to compensate for the determined frequencies utilizing the tuning-elements within the fine-tuning bank of the tunable oscillator; and
    storing the determined offset codes in a look-up table or utilizing a determined offset code to determine the initialization code.

5. The method of claim 1, comprising:
    performing a coarse calibration process starting with the set digital-fine tuning control code;
    setting a coarse-tuning control code at least partially responsive to the coarse calibration process;
    performing a fine calibration process after the coarse calibration process; and
        setting the fine-tuning control code at least partially responsive to the fine calibration process.

6. The method of claim 1, comprising:
    obtaining an integral control code;
    detecting post-calibration temperature drift, supply voltage drift, or combination thereof, at least partially responsive to the integral control code; and
    set a drift control code to a value proportional to post-calibration drift indicated by the integral control code.

7. The method of claim 6, comprising:
    change a control code applied to an input of the fine bank of tuning-elements in an amount proportional to the set drift control code.

8. The method of claim 6, wherein the detecting post-calibration drift comprises:
    comparing the integral control code with a first predetermined threshold value;
    detecting a first state of the tunable oscillator if the integral control code is higher than the first predetermined value, wherein the first state corresponds to unacceptable post-calibration drift toward a lower output frequency;
    comparing the integral control code with a second predetermined threshold value;
    detecting a second state of the tunable oscillator if the integral control code is lower than the second predetermined threshold value, wherein the second state corresponds to unacceptable post-calibration drift toward a higher output frequency; and detecting a third state of the tunable oscillator if the integral control code is lower than the first threshold predetermined value and higher than the second threshold predetermined value, wherein the third state corresponds to no or acceptable post-calibration drift.

9. The method of claim 1, wherein the PLL includes a digital integral control path and an analog proportional control path.

10. The method of claim 1, wherein the proportional control paths include a digital proportional control path.

11. An apparatus, comprising:
a processor; and
a data storage device to store machine-executable code including executable instructions to adapt or enable the processor to:
receive values indicative of temperature of a tunable oscillator and supply voltage of a phase-locked loop (PLL);
set a digital fine-tuning control code based on an initialization code, the initialization code at least partially based on the received values indicative of one or more of a temperature value of the tunable oscillator and a supply voltage of the PLL, wherein the digital fine-tuning control code for setting a number of tuning-elements within a fine bank of the tunable oscillator; and
start calibration of the PLL with the set digital fine-tuning control code, wherein the executable instructions to adapt or enable the processor to set the digital fine-tuning control code to the initialization code to:
obtain an offset code associated with the received values indicative of one or more of a temperature value of the tunable oscillator and supply voltage of the PLL;
set the initialization code to one-half (½) range of the digital fine-tuning control code; and
change the set initialization code by an amount represented by the offset code.

12. The apparatus of claim 11, wherein the executable instructions to adapt or enable the processor to set the digital fine-tuning control code to the initialization code comprise executable instructions to:
set the digital fine-tuning control code to the changed set initialization code.

13. The apparatus of claim 11, wherein the machine-executable code including executable instructions to adapt or enable the processor to:
obtain parameters representing a frequency response of the tunable oscillator to changes in supply voltage and temperature, and predetermined ranges of temperature and supply voltage;
determine a number of tuning-elements within a fine-tuning bank of a tunable oscillator;
determine respective frequencies of the tunable oscillator in response to respective temperature values and respective supply voltage values, and determine respective offset codes to compensate for the determined frequencies utilizing the tuning-elements within the fine-tuning bank of the tunable oscillator; and
store the determined offset codes in a look-up table or utilizing the determined offset codes to determine the initialization code.

14. The apparatus of claim 11, wherein the machine-executable code including executable instructions to adapt or enable the processor to:
perform a coarse calibration process starting with the set digital-fine tuning control code;
set a coarse-tuning control code at least partially responsive to the coarse calibration process;
perform a fine calibration process after the coarse calibration process; and
set the fine-tuning control code at least partially responsive to the fine calibration process.

15. The apparatus of claim 11, wherein the machine-executable code including executable instructions to adapt or enable the processor to:
obtain an integral control code;
detect post-calibration drift at least partially responsive to changes in the integral control code; and
set a drift control code to a value proportional to post-calibration drift indicated by changes in the integral control code.

16. The apparatus of claim 15, wherein the machine-executable code including executable instructions to adapt or enable the processor to:
changing the fine-tuning control code having been set responsive to a fine calibration process in an amount proportional to the set drift control code.

17. An apparatus comprising:
a tunable oscillator to generate an output signal;
an error detector to generate an error signal indicative of a phase or frequency difference between the output signal and a reference signal;
a voltage monitor to generate a value representative of a supply voltage of the apparatus;
a temperature monitor to generate a value representative of the temperature of the apparatus;
one or more controllers to provide to the tunable oscillator:
a proportional control signal to the tunable oscillator least partially responsive to the error signal generated by the error detector;
an integral control code or an integral control signal;
a coarse-tuning control code; and
a fine-tuning control code, wherein the one or more controller to set the fine-tuning control code at least partially responsive to one or more of the values respectively representative of the supply voltage of the apparatus or the temperature of the apparatus.

18. The apparatus of claim 17, wherein the integral control code or the integral control signal is indicative of magnitude of integral control action applied to the tunable oscillator to urge the oscillator frequency toward a target frequency.

19. The apparatus of claim 17, comprising:
an analog controller of the one or more controllers, the analog controller to provide the proportional control signal; and
a digital controller of the one or more controllers, the digital controller to provide the integral control code or an integral control signal, the coarse-tuning control code, and the fine-tuning control code.

20. The apparatus of claim 17, comprising a digital controller of the one or more controllers, the digital controller to provide: the proportional control signal, the integral control code or an integral control signal, the coarse-tuning control code, and the fine-tuning control code.

* * * * *